US012733222B2

(12) United States Patent
Lin et al.

(10) Patent No.: US 12,733,222 B2
(45) Date of Patent: Sep. 8, 2026

(54) SEMICONDUCTOR DEVICE STRUCTURE WITH BORON- AND NITROGEN-CONTAINING MATERIAL AND METHOD FOR FORMING THE SAME

(71) Applicant: TAIWAN SEMICONDUCTOR MANUFACTURING COMPANY, LTD., Hsinchu (TW)

(72) Inventors: Cheng-Ming Lin, Kaohsiung City (TW); Szu-Hua Chen, Tainan City (TW); Wei-Yen Woon, Taoyuan City (TW); Szuya Liao, Zhubei Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 964 days.

(21) Appl. No.: 17/880,883

(22) Filed: Aug. 4, 2022

(65) Prior Publication Data

US 2024/0047523 A1 Feb. 8, 2024

(51) Int. Cl.

| | |
|---|---|
| ***H10D 62/10*** | (2025.01) |
| ***H10D 64/01*** | (2025.01) |
| ***H10D 64/68*** | (2025.01) |
| ***H10P 14/43*** | (2026.01) |

(52) U.S. Cl.

CPC ......... *H10D 62/121* (2025.01); *H10D 62/115* (2025.01); *H10D 64/021* (2025.01); *H10D 64/691* (2025.01); *H10P 14/43* (2026.01)

(58) Field of Classification Search

CPC ....... H10D 62/115–121; H10D 64/021; H10D 64/691; H10P 14/43

See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2009/0263972 | A1* | 10/2009 | Balseanu | H10P 50/73 257/E21.249 |

(Continued)

OTHER PUBLICATIONS

Islas, Borazine: To be or not to be aromatic, 2007 (Year: 2007).*

(Continued)

*Primary Examiner* — Britt Hanley
*Assistant Examiner* — Casey Paul Boatman
(74) *Attorney, Agent, or Firm* — Birch, Stewart, Kolasch & Birch, LLP

(57) ABSTRACT

A method for forming a semiconductor device structure is provided. The method includes forming a gate stack over a substrate. The method includes forming a spacer over first sidewalls of the gate stack using a first precursor. The first precursor includes a first boron- and nitrogen-containing material having a first hexagonal ring structure, the spacer has a plurality of first layers, and each first layer includes boron and nitrogen.

20 Claims, 30 Drawing Sheets

(56) References Cited

U.S. PATENT DOCUMENTS

| | | | | |
|---|---|---|---|---|
| 2019/0035694 | A1* | 1/2019 | More | H10D 84/0181 |
| 2019/0214459 | A1* | 7/2019 | Cheng | H10D 30/024 |
| 2020/0075720 | A1* | 3/2020 | Cheng | H10D 30/014 |

OTHER PUBLICATIONS

Park, Large-Area Monolayer Hexagonal Boron Nitride on Pt Foil, 2014 (Year: 2014).*

Shi, Theoretical study on a kind of cyclization mechanism of boron trichloride and hexamethyldisilazane to form the borazine ring for SiBCN ceramics precursor, 2021 (Year: 2021).*

* cited by examiner

3A'
110
150
154
150
120
160
180
120
112
114
180
112
3A
170

461
461
428a
460
461 461
A1
551
428
520
550

600
570
510
520
490
420
470
410
TH
592
460
560
550
A1
428
426
424
422
480
414
412
A2

SEMICONDUCTOR DEVICE STRUCTURE WITH BORON- AND NITROGEN-CONTAINING MATERIAL AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1D-1 is a top view of the semiconductor device structure of FIG. 1D, in accordance with some embodiments.

FIG. 1E-1 is a top view of the semiconductor device structure of FIG. 1E, in accordance with some embodiments.

FIG. 1F-1 is a top view of the semiconductor device structure of FIG. 1F, in accordance with some embodiments.

FIGS. 2A-2F are perspective views of various stages of a process for forming a semiconductor device structure, in accordance with some embodiments.

FIG. 2A-1 is a cross-sectional view illustrating the semiconductor device structure along a sectional line I-I' in FIG. 2A, in accordance with some embodiments.

FIG. 2A-2 is an enlarged view of a region of the semiconductor device structure of FIG. 2A-1, in accordance with some embodiments.

FIG. 2A-3 is a schematic of a boron nitride structure, in accordance with some embodiments.

FIG. 2A-4 is a schematic of a boron carbon nitride structure, in accordance with some embodiments.

FIG. 2D-1 is a cross-sectional view illustrating the semiconductor device structure along a sectional line I-I' in FIG. 2D, in accordance with some embodiments.

FIG. 2D-2 is an enlarged view of a region of the semiconductor device structure of FIG. 2D-1, in accordance with some embodiments.

FIGS. 3A-3H are cross-sectional views of various stages of a process for forming a semiconductor device structure, in accordance with some embodiments.

FIG. 3E-1 is an enlarged view of a region of the semiconductor device structure of FIG. 3E, in accordance with some embodiments.

FIG. 3H-1 is an enlarged view of a region of the semiconductor device structure of FIG. 3H, in accordance with some embodiments.

FIGS. 4A-4L are cross-sectional views of various stages of a process for forming a semiconductor device structure, in accordance with some embodiments.

FIG. 4A-1 is a perspective view of the semiconductor device structure of FIG. 4A, in accordance with some embodiments.

FIG. 4A-2 is an enlarged view of a region of the semiconductor device structure of FIG. 4A, in accordance with some embodiments.

FIG. 4B-1 is a perspective view of the semiconductor device structure of FIG. 4B, in accordance with some embodiments.

FIG. 4D-1 is an enlarged view of a region of the semiconductor device structure of FIG. 4D, in accordance with some embodiments.

FIG. 4F-1 is an enlarged view of a region of the semiconductor device structure of FIG. 4F, in accordance with some embodiments.

FIG. 4J-1 is an enlarged view of a region of the semiconductor device structure of FIG. 4J, in accordance with some embodiments.

FIG. 4L-1 is an enlarged view of one region of the semiconductor device structure of FIG. 4L, in accordance with some embodiments.

FIG. 4L-2 is an enlarged view of another one region of the semiconductor device structure of FIG. 4L, in accordance with some embodiments.

DETAILED DESCRIPTION

Figures 1, 1A:
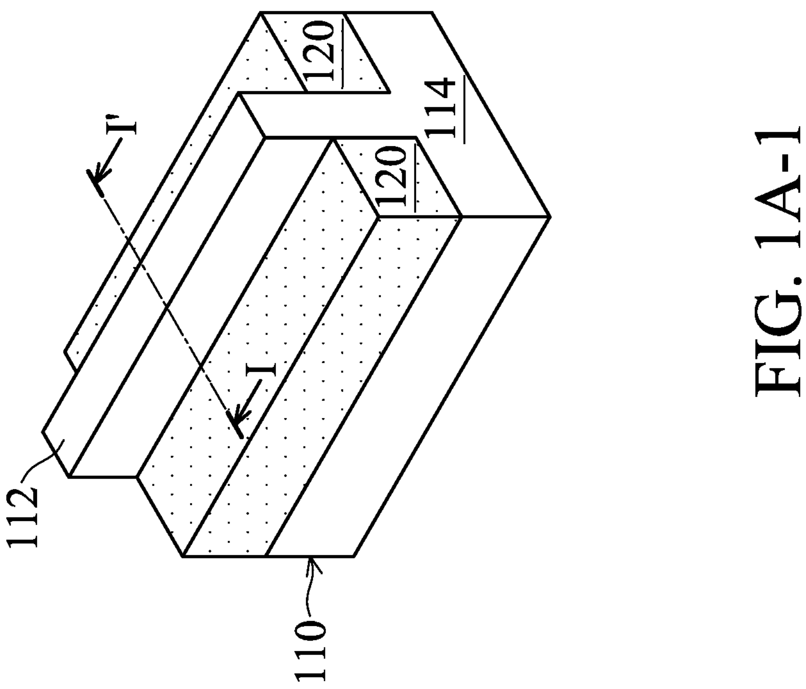
Figure 1A:
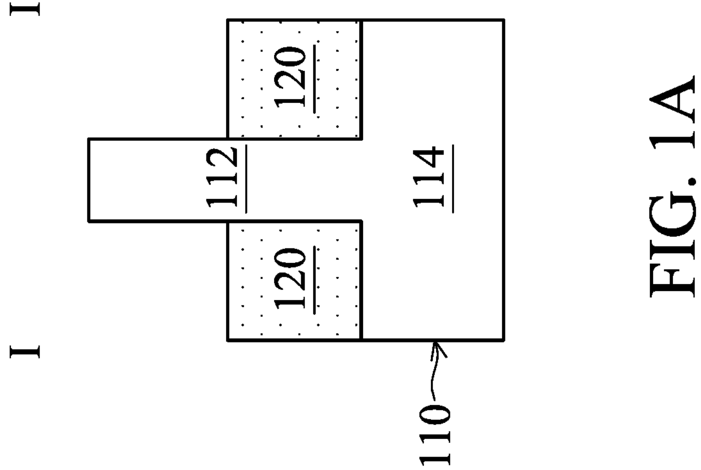
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" or "about" in the description, such as in "substantially flat" or in "substantially coplanar", etc., will be understood by the person skilled in the art. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain structure(s) may refer to a source or a drain, individually or collectively dependent upon the context.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1F are cross-sectional views of various stages of a process for forming a semiconductor device structure, in accordance with some embodiments. FIG. 1A-1 is a perspective view of the semiconductor device structure of FIG. 1A, in accordance with some embodiments. FIG. 1A is a cross-sectional view illustrating the semiconductor device structure along a sectional line I-I' in FIG. 1A-I, in accordance with some embodiments.

As shown in FIGS. 1A and 1A-1, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, the substrate 110 has a fin 112 and a base 114, in accordance with some embodiments. The fin 112 is over the base 114, in accordance with some embodiments. As shown in FIGS. 1A and 1A-1, an isolation layer 120 is formed over the base 114, in accordance with some embodiments.

The fin 112 is partially in the isolation layer 120, in accordance with some embodiments. The isolation layer 120 surrounds a lower portion of the fin 112, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

Figure 1C:
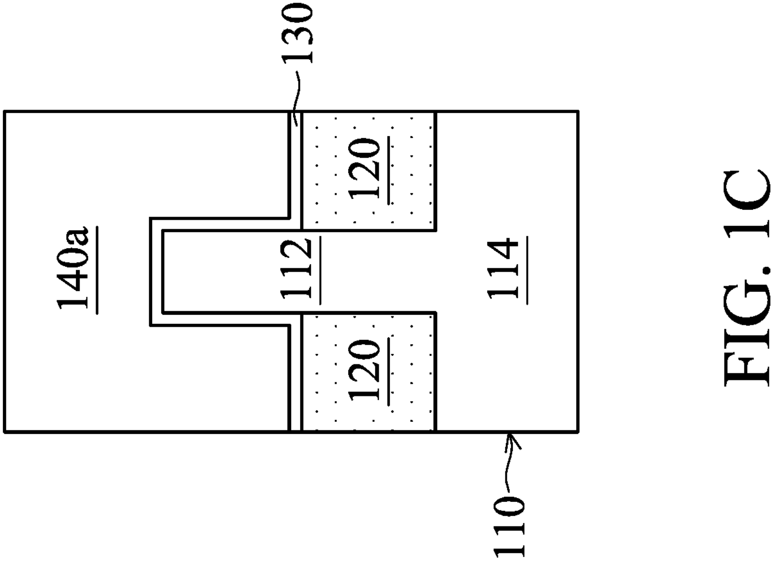
Figure 1B:
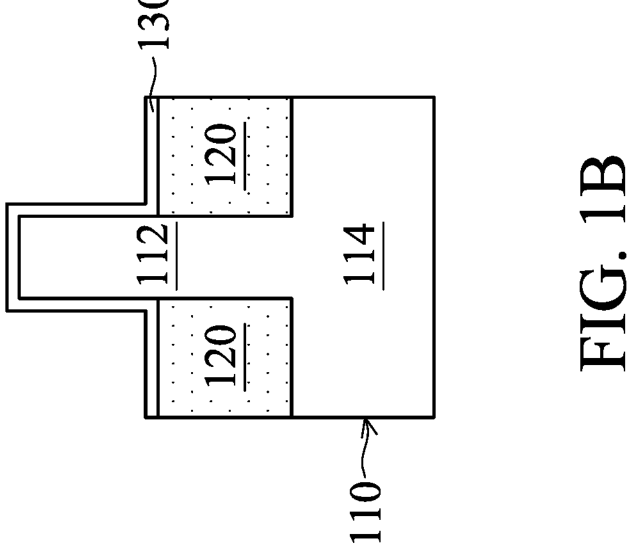

As shown in FIG. 1B, a gate dielectric layer 130 is deposited over the isolation layer 120 and the fin 112, in accordance with some embodiments. The gate dielectric layer 130 conformally covers the isolation layer 120 and the fin 112, in accordance with some embodiments. The gate dielectric layer 130 is made of oxide, such as silicon oxide (e.g. $SiO_2$), in accordance with some embodiments. The gate dielectric layer 130 is also referred to as an oxide layer, in accordance with some embodiments.

The gate dielectric layer 130 is deposited using a chemical vapor deposition (CVD) process, an atomic layer deposition (ALD) process, a plasma enhanced atomic layer deposition (PEALD) process, or another suitable deposition process.

As shown in FIG. 1C, a gate electrode layer 140*a* is formed over the gate dielectric layer 130, in accordance with some embodiments. The gate electrode layer 140*a* is in direct contact with the gate dielectric layer 130, in accordance with some embodiments. The gate electrode layer 140*a* is made of polysilicon, in accordance with some embodiments. The gate electrode layer 140*a* is formed using a chemical vapor deposition process or another suitable process.

Figures 1, 1D:
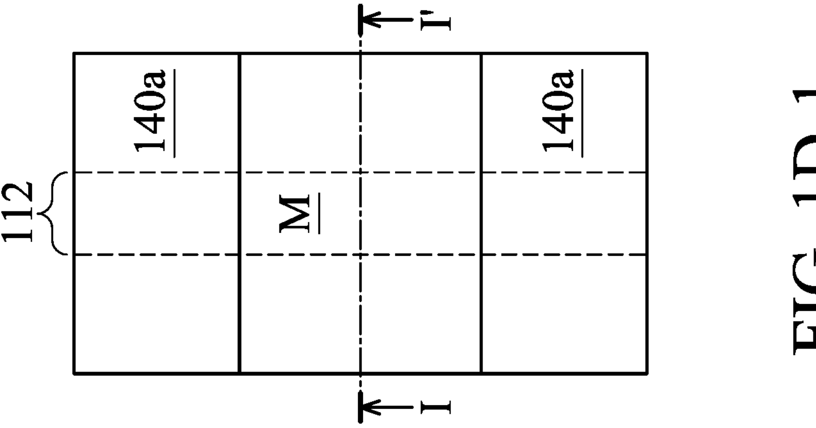
Figure 1D:
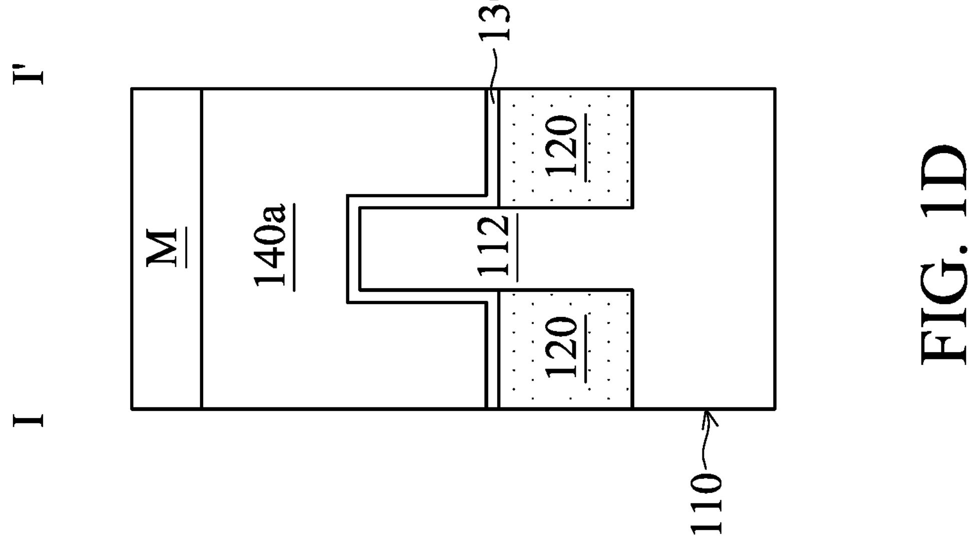

FIG. 1D-1 is a top view of the semiconductor device structure of FIG. 1D, in accordance with some embodiments. FIG. 1D is a cross-sectional view illustrating the semiconductor device structure along a sectional line I-I' in FIG. 1D-1, in accordance with some embodiments.

As shown in FIGS. 1D and 1D-1, a mask layer M is formed over the gate electrode layer 140*a*, in accordance with some embodiments. The mask layer M is made of a photoresist material or another suitable material, which is different from the material of the gate electrode layer 140*a*, in accordance with some embodiments.

Figures 1, 1E:
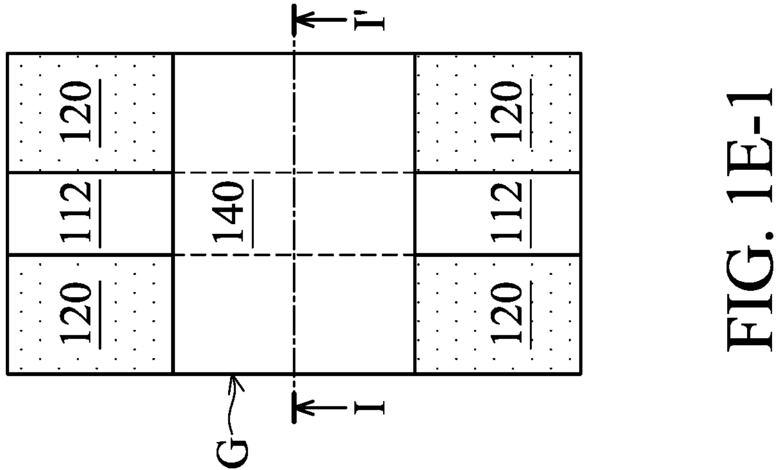
Figure 1E:
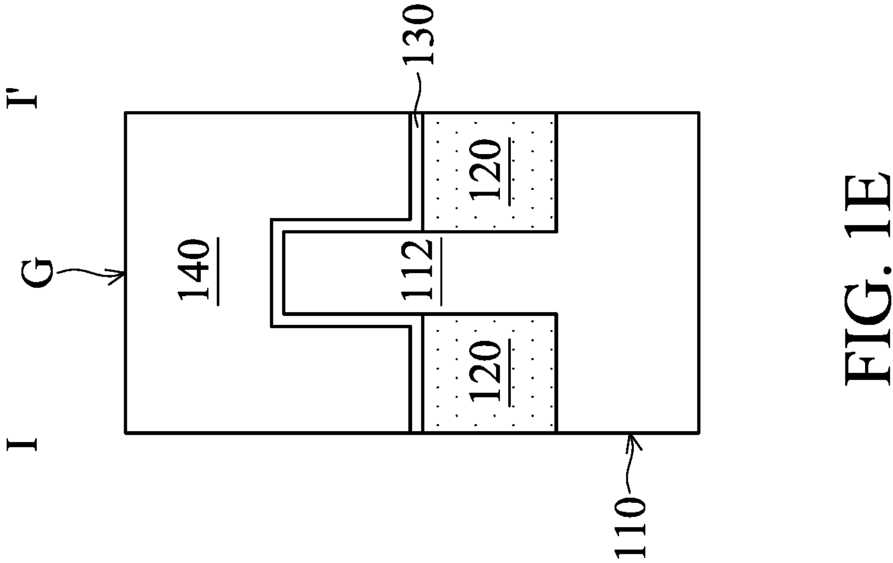

FIG. 1E-1 is a top view of the semiconductor device structure of FIG. 1E, in accordance with some embodiments. FIG. 1E is a cross-sectional view illustrating the semiconductor device structure along a sectional line I-I' in FIG. 1E-1, in accordance with some embodiments.

As shown in FIGS. 1D-1, 1E, and 1E-1, portions of the gate electrode layer 140*a* and the gate dielectric layer 130, which are not under the mask layer M, are removed, in accordance with some embodiments. After the removal process, the remaining gate electrode layer 140*a* forms a gate electrode 140, in accordance with some embodiments.

After the removal process, the gate electrode 140 and the remaining gate dielectric layer 130 together form a gate stack G, in accordance with some embodiments. Thereafter, as shown in FIGS. 1E and 1E-1, the mask layer M is removed, in accordance with some embodiments.

Figures 1, 1F:
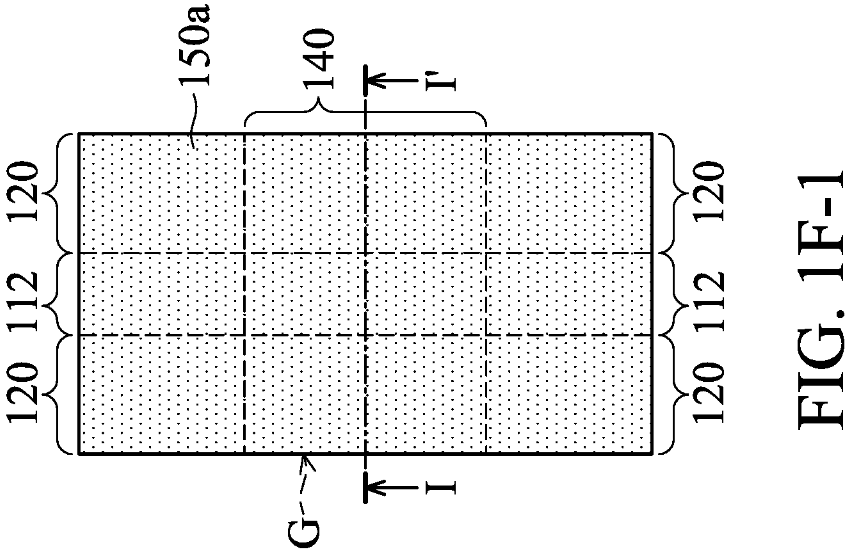
Figure 1F:
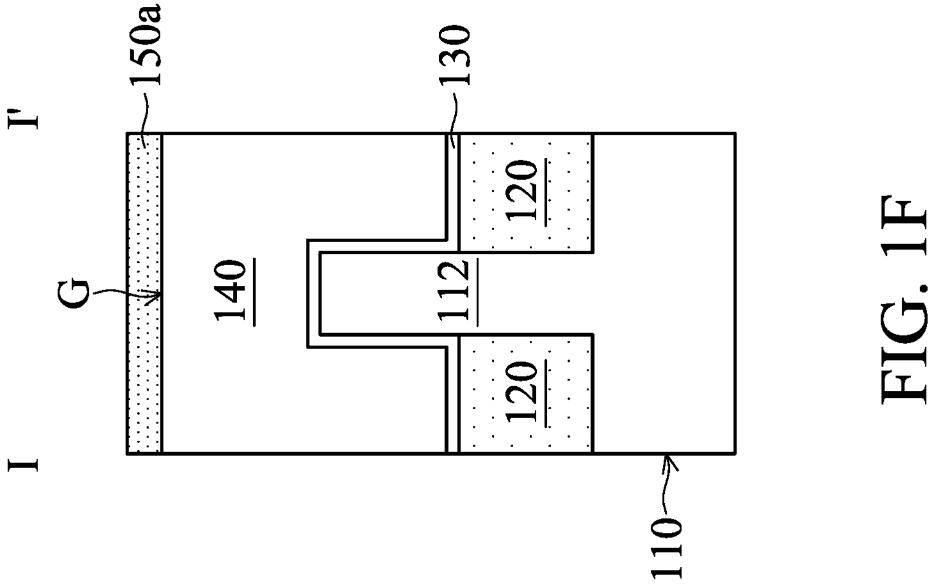

FIG. 1F-1 is a top view of the semiconductor device structure of FIG. 1F, in accordance with some embodiments. FIG. 1F is a cross-sectional view illustrating the semiconductor device structure along a sectional line I-I' in FIG. 1F-1, in accordance with some embodiments.

Figures 1, 2A:
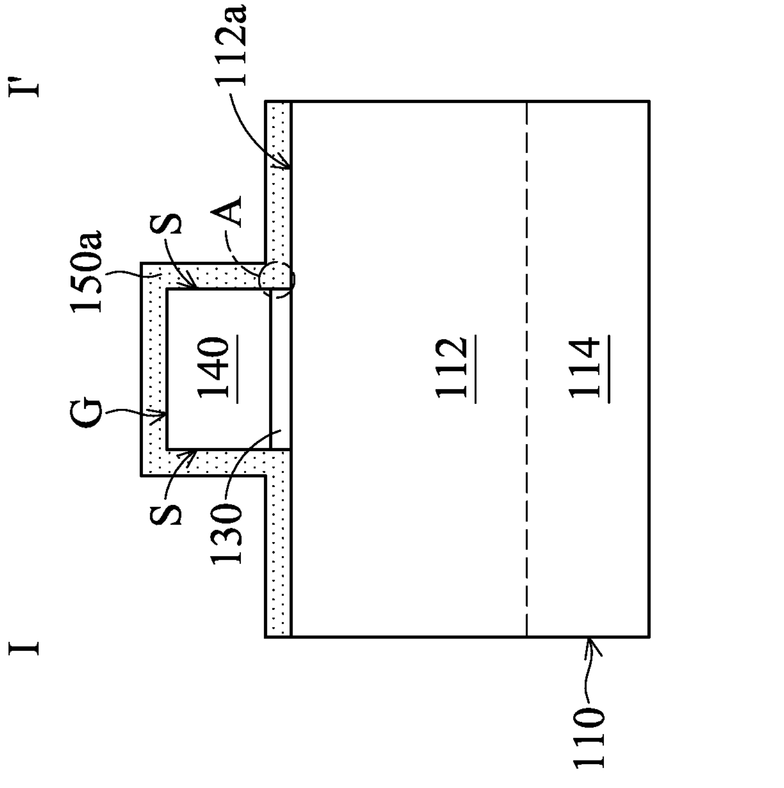
Figure 2A:
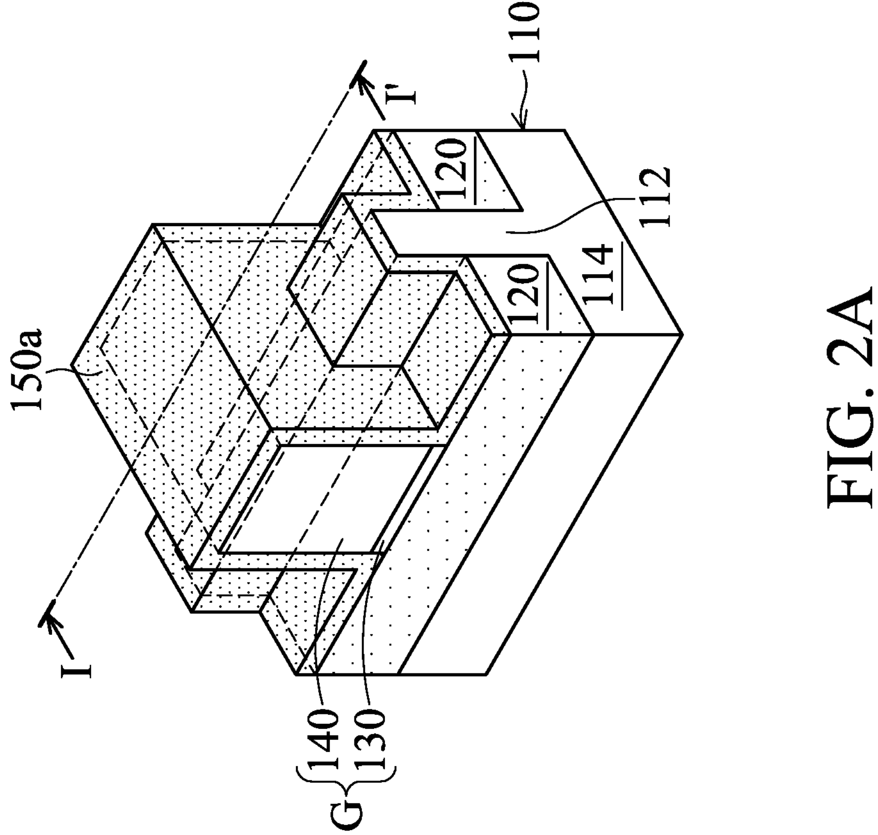

FIG. 2A is a perspective view of the semiconductor device structure of FIG. 1F, in accordance with some embodiments. FIG. 2A-1 is a cross-sectional view illustrating the semiconductor device structure along a sectional line I-I' in FIG. 2A, in accordance with some embodiments.

Thereafter, as shown in FIGS. 1F, 1F-1, 2A, and 2A-1, a spacer layer 150*a* is formed over the gate stack G, the fin 112, and the isolation layer 120, in accordance with some embodiments. The spacer layer 150*a* is conformally deposited over the gate stack G, the fin 112, and the isolation layer 120, in accordance with some embodiments.

The spacer layer 150*a* is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Figures 2, 2A:
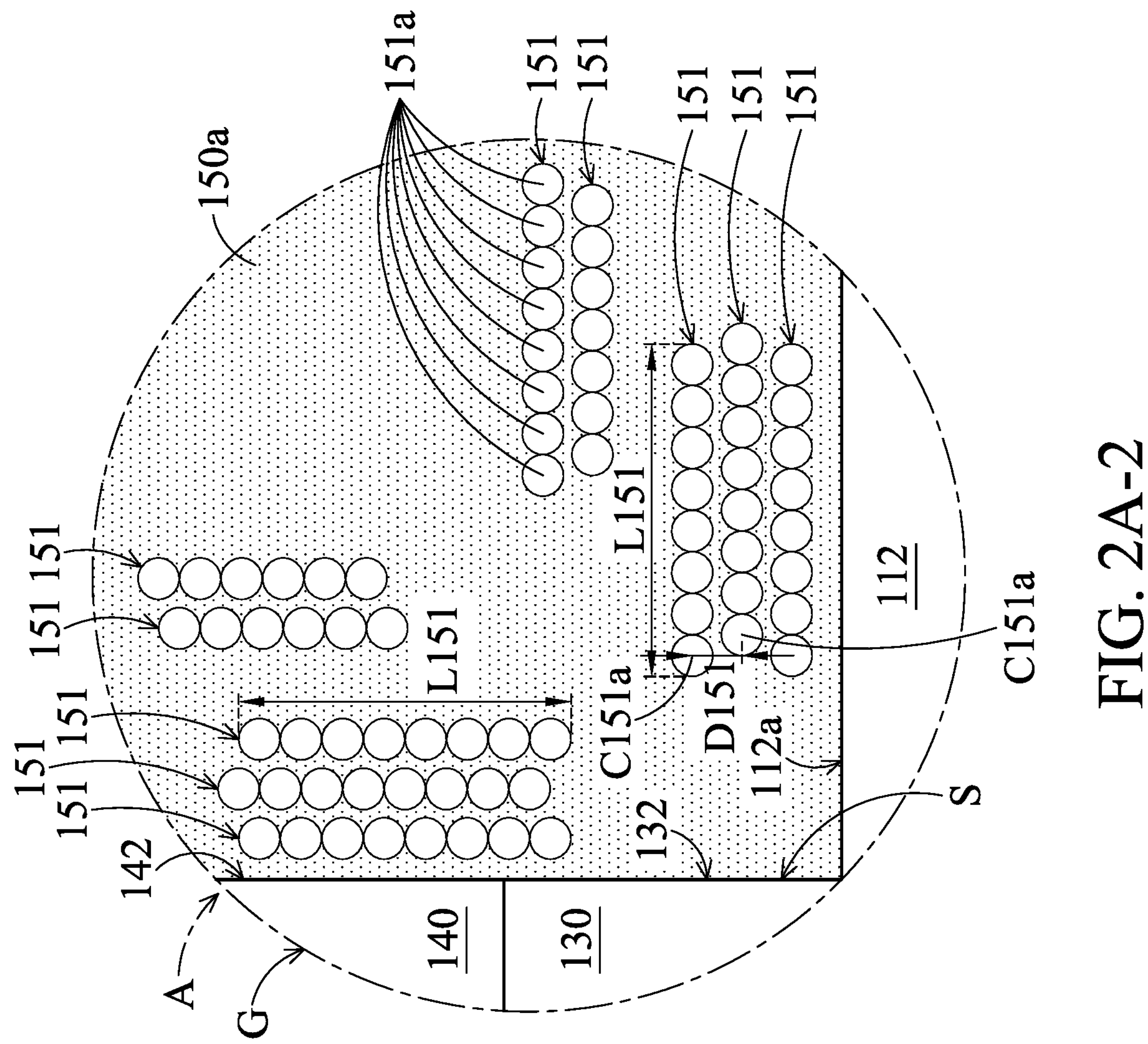

Since the hexagonal ring structure is a 2D (2 dimensions) structure, the spacer layer 150*a* tends to have a layered structure, in accordance with some embodiments. FIG. 2A-2 is an enlarged view of a region A of the semiconductor device structure of FIG. 2A-1, in accordance with some embodiments.

As shown in FIGS. 2A-1 and 2A-2, the spacer layer 150*a* has layers 151, in accordance with some embodiments. In some embodiments, some layers 151 are substantially parallel to the sidewall S of the gate stack G (or the sidewalls 132 and 142 of the gate dielectric layer 130 and the gate electrode 140). In some other embodiments, some layers 151 are substantially parallel to a top surface 112*a* of the fin 112 of the substrate 110.

Figures 2, 2A, 3, 4:
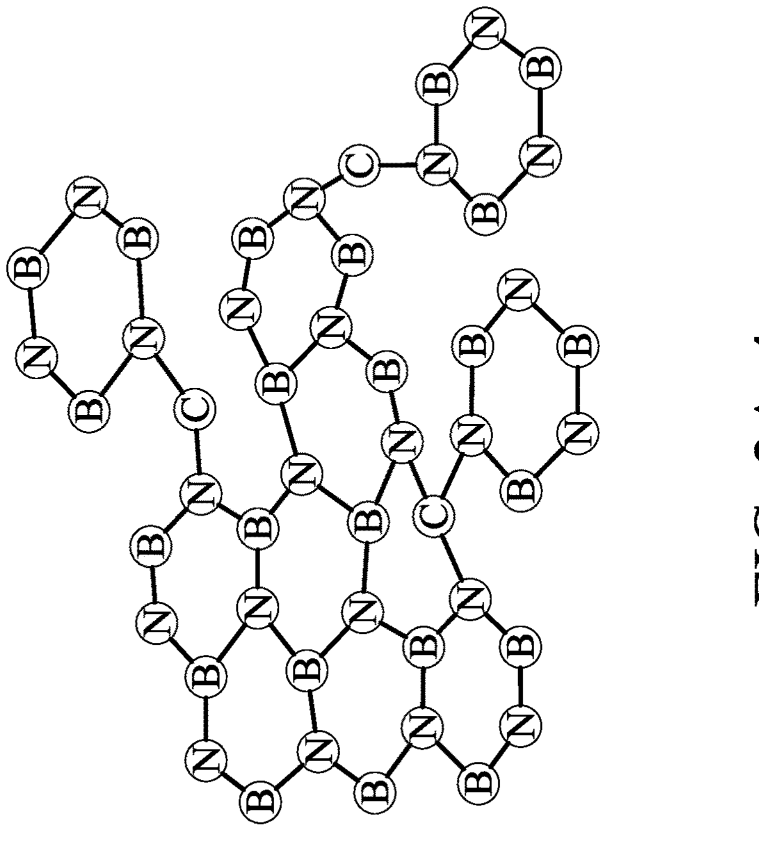
Figures 2, 2A, 3:
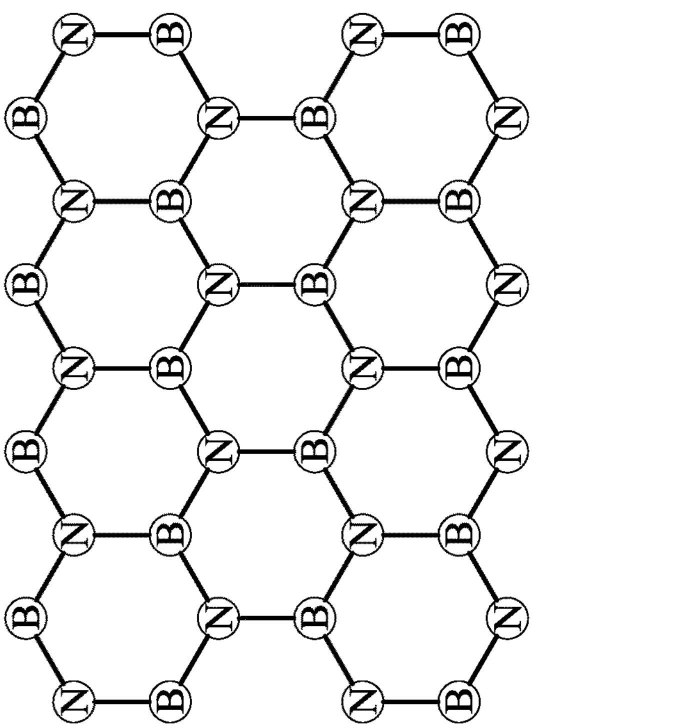

Each layer 151 includes a boron- and nitrogen-containing material having a hexagonal ring structure, in accordance with some embodiments. The layers 151 are monatomic layers, in accordance with some embodiments. Each layer 151 includes atoms 151*a*, in accordance with some embodiments. The atoms 151*a* include boron and nitrogen, in accordance with some embodiments. FIG. 2A-3 is a schematic of a boron nitride structure, in accordance with some embodiments. As shown in FIGS. 2A-2 and 2A-3, each layer 151 includes hexagonal boron nitride, in accordance with some embodiments.

In some embodiments, the atoms 151*a* include boron, nitrogen, and carbon, in accordance with some embodiments. FIG. 2A-4 is a schematic of a boron carbon nitride structure, in accordance with some embodiments. As shown in FIGS. 2A-2 and 2A-4, each layer 151 includes hexagonal boron carbon nitride, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the spacer layer 150*a*, in accordance with some embodiments. Therefore, the parasitic capacitance of a semiconductor device structure with the spacer layer 150*a* is lowered, which improves the performance of the semiconductor device structure, in accordance with some embodiments. The dielectric constant of the spacer layer 150*a* ranges from about 1.8 to about 2, in accordance with some embodiments.

Furthermore, the hexagonal boron nitride and hexagonal boron carbon nitride are high density materials, which increases the density of the spacer layer 150*a*, in accordance with some embodiments. Therefore, the mechanical property of the spacer layer 150*a* is improved, which improves the reliability of the semiconductor device structure with the spacer layer 150*a*, in accordance with some embodiments. The density of the spacer layer 150*a* ranges from about 2.1 $g/cm^3$ to about 2.3 $g/cm^3$, in accordance with some embodiments.

The average length L151 of the layers 151 ranges from about 2 nm to about 10 nm, in accordance with some embodiments. The average spacing D151 between two adjacent layers 151 ranges from about 0.1 nm to about 0.5 nm, in accordance with some embodiments. The average spacing D151 is a distance between the centers C151*a* of the atoms 151*a* of two adjacent layers 151, in accordance with some embodiments.

The volume ratio of the layers 151 to the spacer layer 150*a* ranges from about 60% to about 99%, in accordance with some embodiments. The atomic concentration of boron in the spacer layer 150*a* ranges from about 40% to about 50%, in accordance with some embodiments. The atomic concentration of nitrogen in the spacer layer 150*a* ranges from about 40% to about 50%, in accordance with some embodiments. The atomic concentration of carbon in the spacer layer 150*a* ranges from about 0.1% to about 10%, in accordance with some embodiments. In some embodiments, the spacer layer 150*a* has no carbon.

The spacer layer 150*a* is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 151 to the spacer layer 150*a* is too low to lower the dielectric constant of the spacer layer 150*a*, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the spacer layer 150*a* over the gate stack G, the fin 112, and the isolation layer 120; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube is within a range of about −20° C. to about 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube is within a range of about 20° C. to about 30° C. (i.e., room temperature), in accordance with some embodiments. The precursor containing $B_3N_3H_5CH_3$, $B_3N_3H_5C_2H_5$, or $B_3N_3H_3(CH_3)_3$ is more stable than the precursor containing $B_3N_3H_6$, in accordance with some embodiments.

Figure 2C:
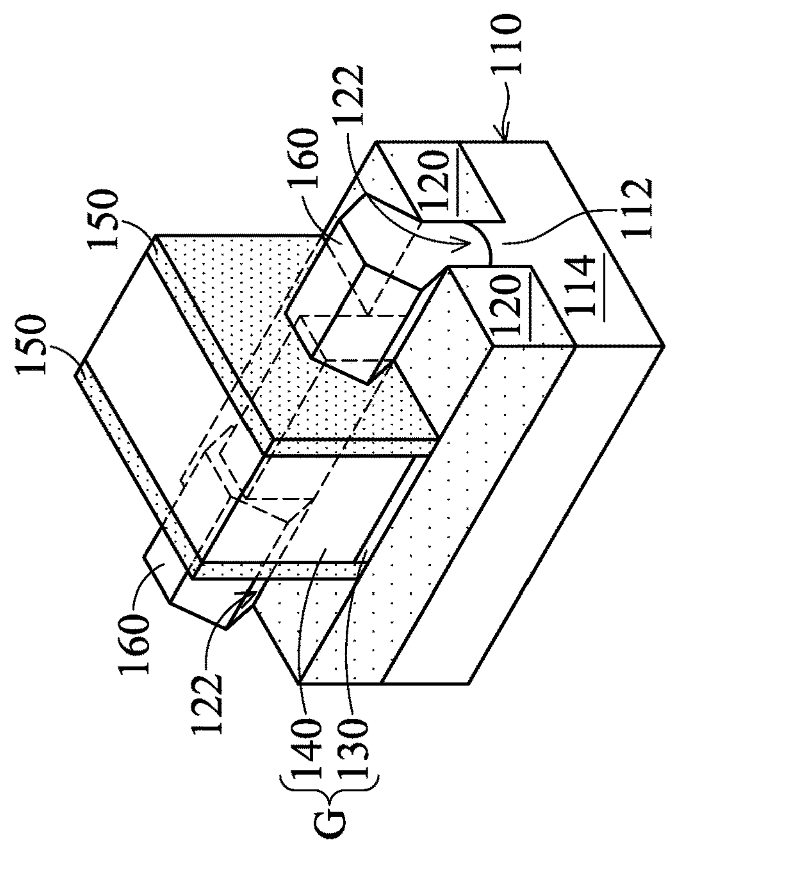
Figure 2B:
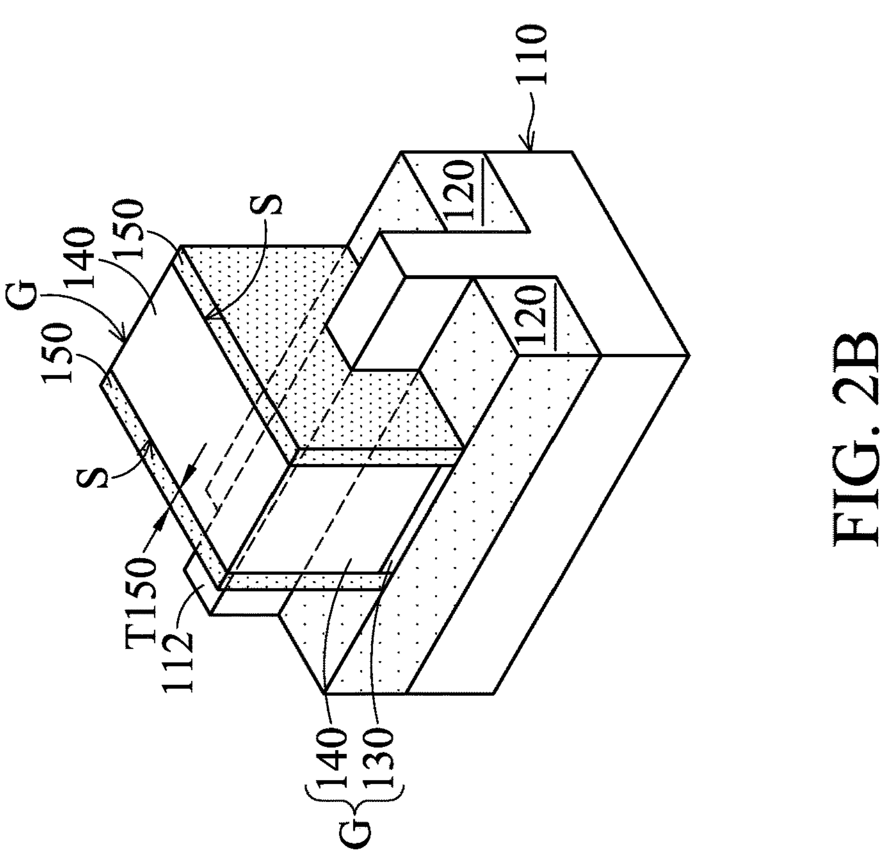

FIGS. 2A-2F are perspective views of various stages of a process for forming a semiconductor device structure, in accordance with some embodiments. After the step of FIG. 2A, as shown in FIG. 2B, portions of the spacer layer 150*a* are removed, in accordance with some embodiments. The remaining portion of the spacer layer 150*a* forms a spacer 150 over sidewalls S of the gate stack G, in accordance with some embodiments.

The spacer 150 surrounds the gate stack G, in accordance with some embodiments. The spacer 150 is positioned over the fin 112 and the isolation layer 120, in accordance with some embodiments. In some embodiments, a thickness T150 of the spacer 150 ranges from about 1 nm to about 100 nm. The removal process includes an anisotropic etching process such as a dry etching process, in accordance with some embodiments.

After the step illustrated in FIG. 2B, as shown in FIG. 2C, the fin 112 is partially removed, in accordance with some embodiments. After the removal process, as shown in FIG. 2C, trenches 122 are formed in the isolation layer 120, in accordance with some embodiments.

As shown in FIG. 2C, source/drain structures 160 are formed in the trenches 122 and on the fin 112, in accordance with some embodiments. The source/drain structures 160 are in direct contact with the fin 112, in accordance with some embodiments. The source/drain structures 160 are positioned on two opposite sides of the gate stack G, in accordance with some embodiments. The source/drain structures 160 include a source structure and a drain structure, in accordance with some embodiments.

In some embodiments, the source/drain structures 160 are made of an N-type conductivity material. The N-type conductivity material includes silicon (Si) or another suitable N-type conductivity material. The source/drain structures 160 are doped with the Group VA element, in accordance with some embodiments. The Group VA element includes phosphor (P), antimony (Sb), or another suitable Group VA material. The source/drain structures 160 are also referred to as doped structures, in accordance with some embodiments.

In some other embodiments, the source/drain structures 160 are made of a P-type conductivity material, in accordance with some embodiments. The P-type conductivity material includes silicon germanium (SiGe) or another suitable P-type conductivity material. The source/drain structures 160 are doped with the Group IIIA element, in accordance with some embodiments. The Group IIIA element includes boron or another suitable material. The source/drain structures 160 are formed using an epitaxial process, in accordance with some embodiments.

Figures 1, 2D:
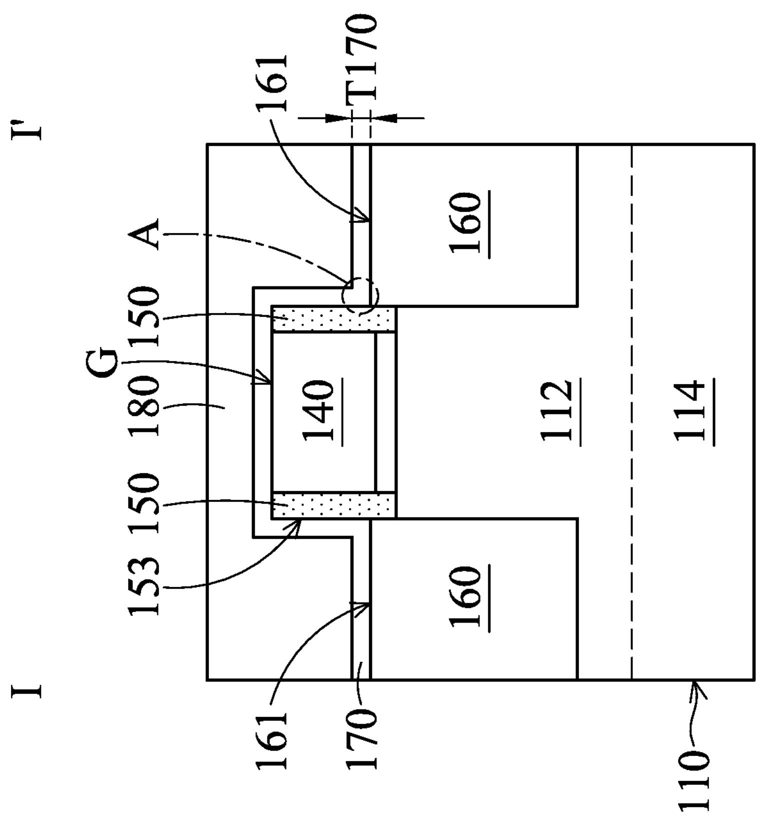
Figure 2D:
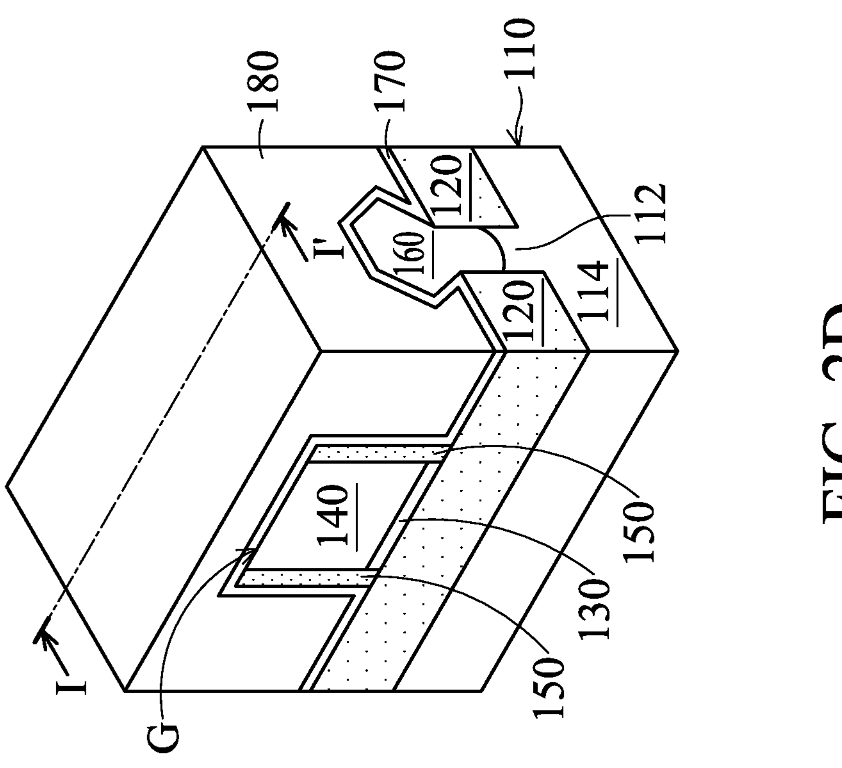

FIG. 2D-1 is a cross-sectional view illustrating the semiconductor device structure along a sectional line I-I' in FIG. 2D, in accordance with some embodiments. As shown in FIGS. 2D and 2D-1, an etch stop layer 170 is formed over the gate stack G, the spacer 150, the isolation layer 120, and the source/drain structures 160, in accordance with some embodiments. The etch stop layer 170 conformally covers sidewalls 153 of the spacer 150 and top surfaces 161 of the source/drain structures 160, in accordance with some embodiments.

The etch stop layer 170 is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Since the hexagonal ring structure is a 2D (2 dimensions) structure, the etch stop layer 170 tends to have a layered structure, in accordance with some embodiments. FIG. 2D-2 is an enlarged view of a region A of the semiconductor device structure of FIG. 2D-1, in accordance with some embodiments.

As shown in FIGS. 2D-1 and 2D-2, the etch stop layer 170 has layers 171, in accordance with some embodiments. In some embodiments, some layers 171 are substantially parallel to the sidewall 153 of the spacer 150 adjacent thereto. In some other embodiments, some layers 171 are substantially parallel to the top surface 161 of the source/drain structure 160 thereunder.

Each layer 171 includes a boron- and nitrogen-containing material having a hexagonal ring structure, in accordance with some embodiments. The layers 171 are monatomic layers, in accordance with some embodiments. Each layer 171 includes atoms 171*a*, in accordance with some embodiments. The atoms 171*a* include boron and nitrogen, in accordance with some embodiments. In some other embodiments, the atoms 171*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the etch stop layer 170, in accordance with some embodiments. Therefore, the parasitic capacitance of a semiconductor device structure with the etch stop layer 170 is lowered, which improves the performance of the semiconductor device structure, in accordance with some embodiments. The dielectric constant of the etch stop layer 170 ranges from about 1.8 to about 2, in accordance with some embodiments.

Furthermore, the hexagonal boron nitride and hexagonal boron carbon nitride are high density materials, which increases the density of the etch stop layer 170, in accordance with some embodiments. Therefore, the mechanical property of the etch stop layer 170 is improved, which improves the reliability of the semiconductor device structure with the etch stop layer 170, in accordance with some embodiments. The density of the etch stop layer 170 ranges from about 2.1 $g/cm^3$ to about 2.3 $g/cm^3$, in accordance with some embodiments.

The average length L171 of the layers 171 ranges from about 2 nm to about 10 nm, in accordance with some embodiments. The average spacing D171 between two adjacent layers 171 ranges from about 0.1 nm to about 0.5 nm, in accordance with some embodiments. The average spacing D171 is a distance between the centers C171*a* of the atoms 171*a* of two adjacent layers 171, in accordance with some embodiments.

The volume ratio of the layers 171 to the etch stop layer 170 ranges from about 60% to about 99%, in accordance with some embodiments. The atomic concentration of boron in the etch stop layer 170 ranges from about 40% to about 50%, in accordance with some embodiments. The atomic concentration of nitrogen in the etch stop layer 170 ranges from about 40% to about 50%, in accordance with some embodiments. The atomic concentration of carbon in the etch stop layer 170 ranges from about 0.1% to about 10%, in accordance with some embodiments. In some embodiments, the etch stop layer 170 has no carbon.

The etch stop layer 170 is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 171 to the etch stop layer 170 is too low to lower the dielectric constant of the etch stop layer 170, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the etch stop layer 170 over the gate stack G, the spacer 150, the isolation layer 120, and the source/drain structures 160; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

As shown in FIGS. 2D and 2D-1, a dielectric layer 180 is formed over the etch stop layer 170, in accordance with some embodiments. The dielectric layer 180 includes oxide, such as silicon oxide (e.g., $SiO_2$), in accordance with some embodiments. The dielectric layer 180 is formed by a chemical vapor deposition (CVD) process, in accordance with some embodiments.

Figures 2, 2D, 2E:
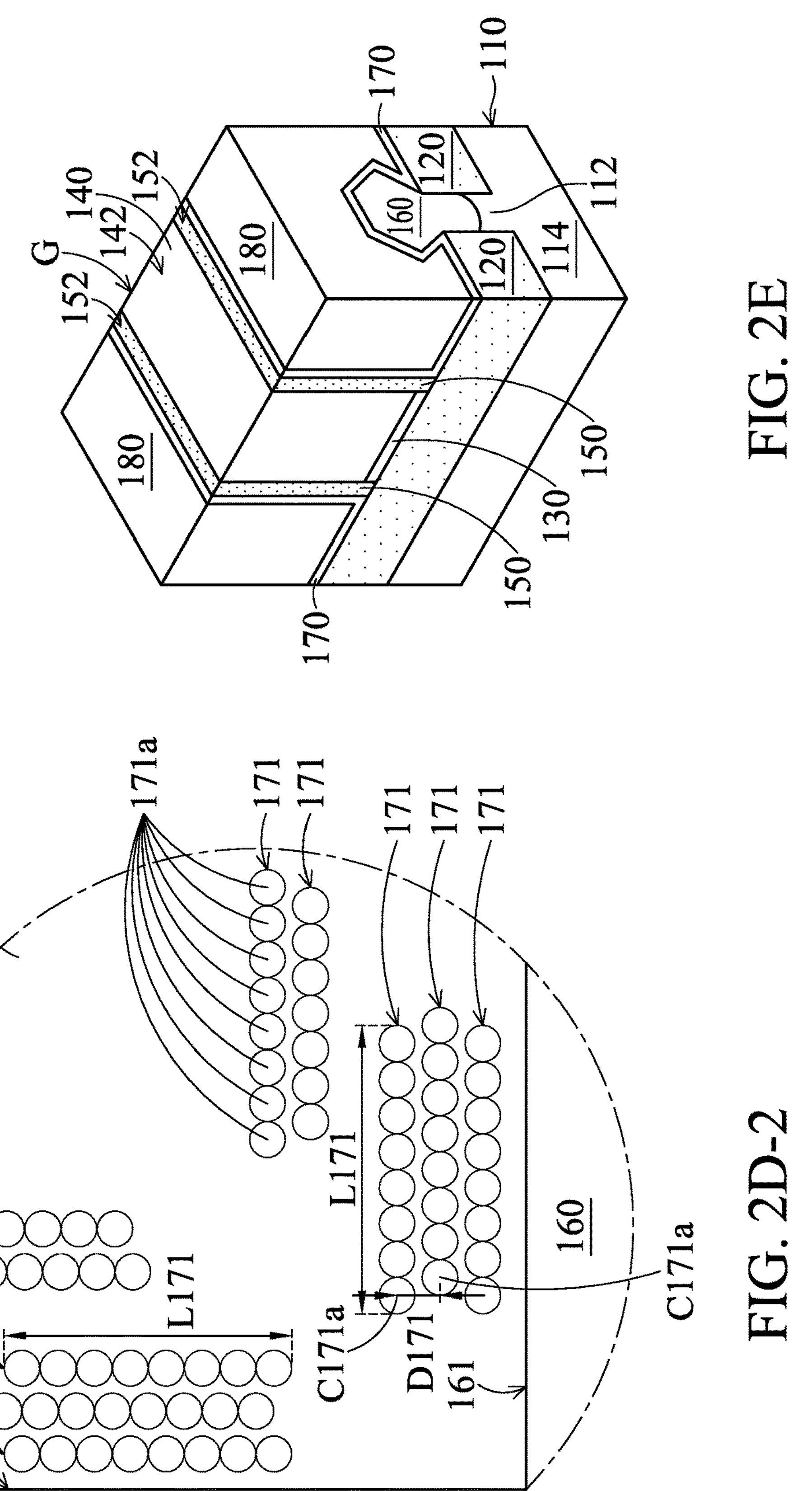

As shown in FIG. 2E, a planarization process is then performed on the dielectric layer 180 until a top surface 142 of the gate electrode 140 is exposed, in accordance with some embodiments. After the planarization process is performed, a top surface 152 of the spacer 150 is exposed, in accordance with some embodiments. The planarization process includes a chemical mechanical polishing (CMP) process, in accordance with some embodiments.

Figures 2F, 3A:
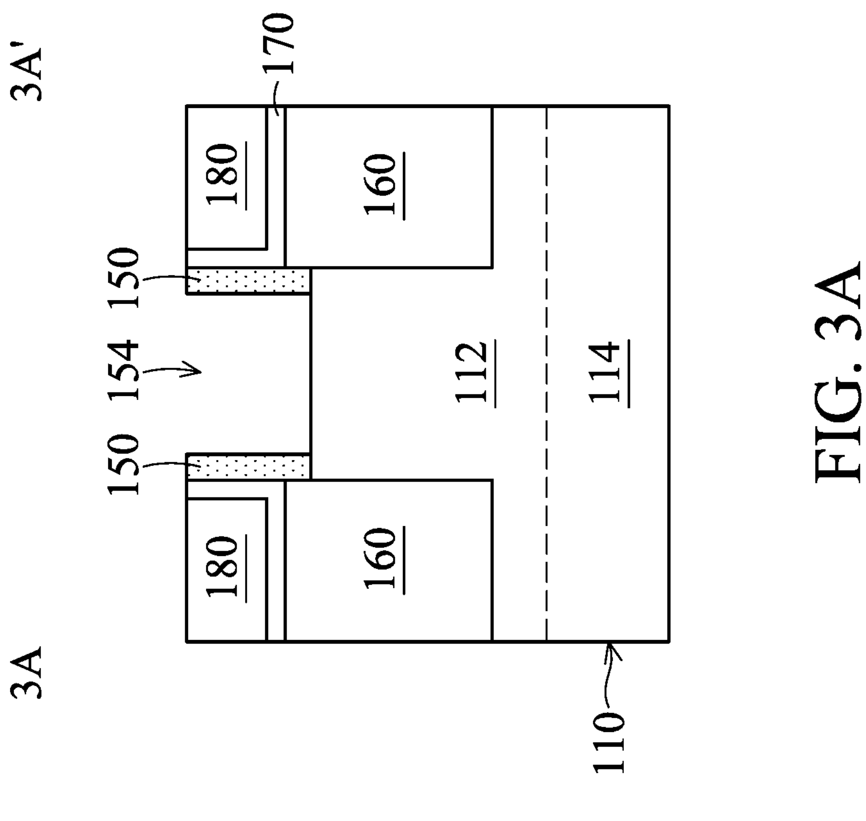

FIG. 3A is a cross-sectional view illustrating the semiconductor device structure along a sectional line 3A-3A' in FIG. 2F, in accordance with some embodiments. As shown in FIGS. 2F and 3A, the gate electrode 140 is removed, in accordance with some embodiments. The removal process includes an etching process, in accordance with some embodiments. As shown in FIG. 2F, the gate dielectric layer 130 is removed, in accordance with some embodiments. The removal process includes an etching process, in accordance with some embodiments.

After the removal processes, a trench 154 is formed in the spacer 150, in accordance with some embodiments. The trench 154 exposes the fin 112 and the isolation layer 120, in accordance with some embodiments.

Figure 3C:
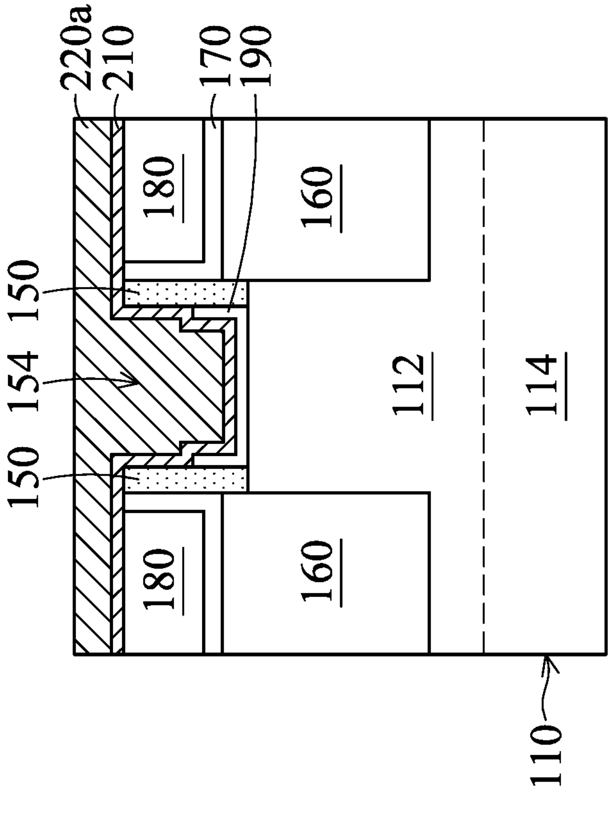
Figure 3B:
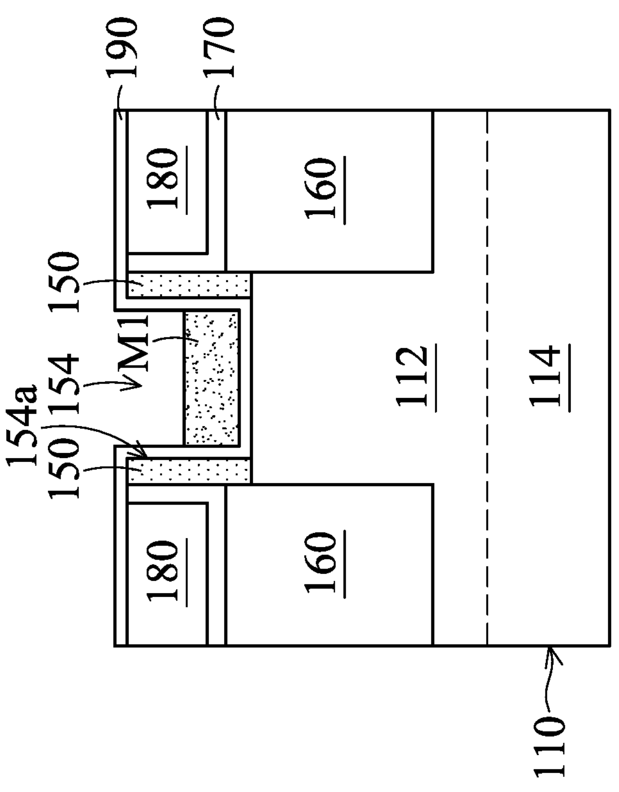

FIGS. 3A-3H are cross-sectional views of various stages of a process for forming a semiconductor device structure, in accordance with some embodiments. After the step of FIG. 3A, as shown in FIG. 3B, a gate dielectric layer 190 is formed over the fin 112, the spacer 150, the etch stop layer 170, and the dielectric layer 180, in accordance with some embodiments. The gate dielectric layer 190 conformally covers the fin 112, the etch stop layer 170, the dielectric layer 180, and inner walls 154*a* of the trench 154 in the spacer 150, in accordance with some embodiments.

The gate dielectric layer 190 is made of a high-K material, such as $HfO_2$, $ZrO_2$, $HfZrO_2$, or $Al_2O_3$, in accordance with some embodiments. The gate dielectric layer 190 is formed using an atomic layer deposition process, a chemical vapor deposition process, or another suitable process.

As shown in FIG. 3B, a mask layer M1 is formed over the gate dielectric layer 190 in the trench 154, in accordance with some embodiments. The mask layer M1 and the gate dielectric layer 190 are made of different materials, in accordance with some embodiments. The mask layer M1 is made of nitride or polymer, such as a photoresist material, in accordance with some embodiments.

As shown in FIGS. 3B and 3C, portions of the gate dielectric layer 190, which are exposed by the mask layer M1, are removed, in accordance with some embodiments. As shown in FIG. 3C, the mask layer M1 is removed, in accordance with some embodiments.

As shown in FIG. 3C, a work function metal layer 210 is formed over the gate dielectric layer 190, the spacer 150, the etch stop layer 170, and the dielectric layer 180, in accordance with some embodiments. The work function metal layer 210 conformally covers the gate dielectric layer 190, the spacer 150, the etch stop layer 170, and the dielectric layer 180, in accordance with some embodiments. The work function metal layer 210 provides a desired work function for transistors to enhance device performance including improved threshold voltage.

In the embodiments of forming an NMOS transistor, the work function metal layer 210 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal layer 210 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

The work function metal layer 210 is formed using a deposition process, in accordance with some embodiments. The deposition process includes a physical vapor deposition (PVD) process, a chemical vapor deposition (CVD) process, an atomic layer deposition (ALD), a plating process, another suitable method, or a combination thereof.

Afterwards, as shown in FIG. 3C, a gate electrode layer 220*a* (also called a metal gate electrode layer) is deposited over the work function metal layer 210 to fill the trench 154, in accordance with some embodiments. The gate electrode layer 220*a* is made of a suitable metal material, such as tungsten or another suitable metal, an alloy thereof, or a combination thereof, in accordance with some embodiments.

Figure 3D:
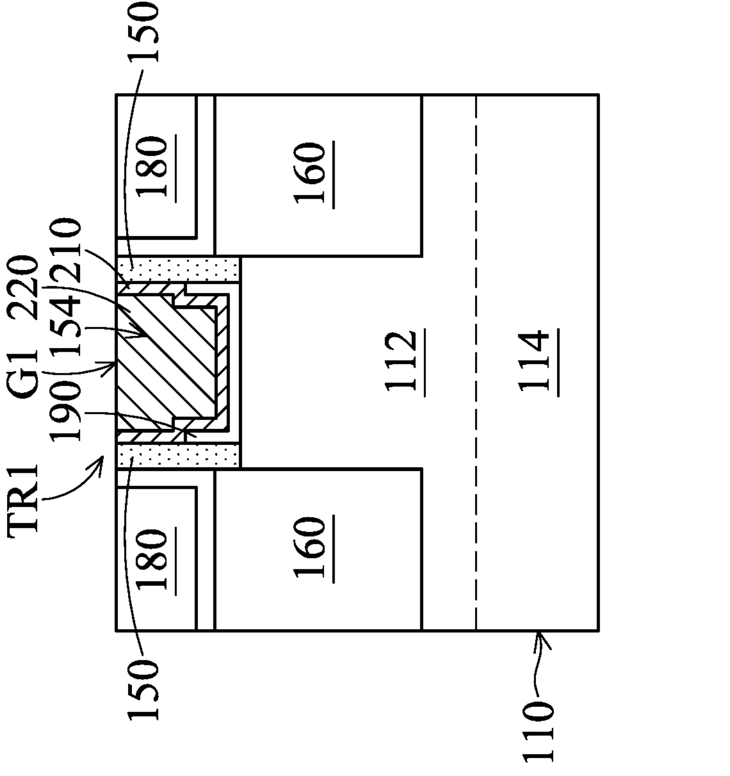

As shown in FIGS. 3C and 3D, upper portions of the gate electrode layer 220*a* and the work function metal layer 210 outside of the trench 154 of the spacer 150 are removed, in accordance with some embodiments. The remaining gate electrode layer 220*a* forms a gate electrode 220, in accordance with some embodiments.

The gate electrode 220, the work function metal layer 210, and the gate dielectric layer 190 together form a metal gate stack G1, in accordance with some embodiments. The metal gate stack G1 and the source/drain structures 160 together form a transistor TR1, in accordance with some embodiments.

Figures 1, 3E:
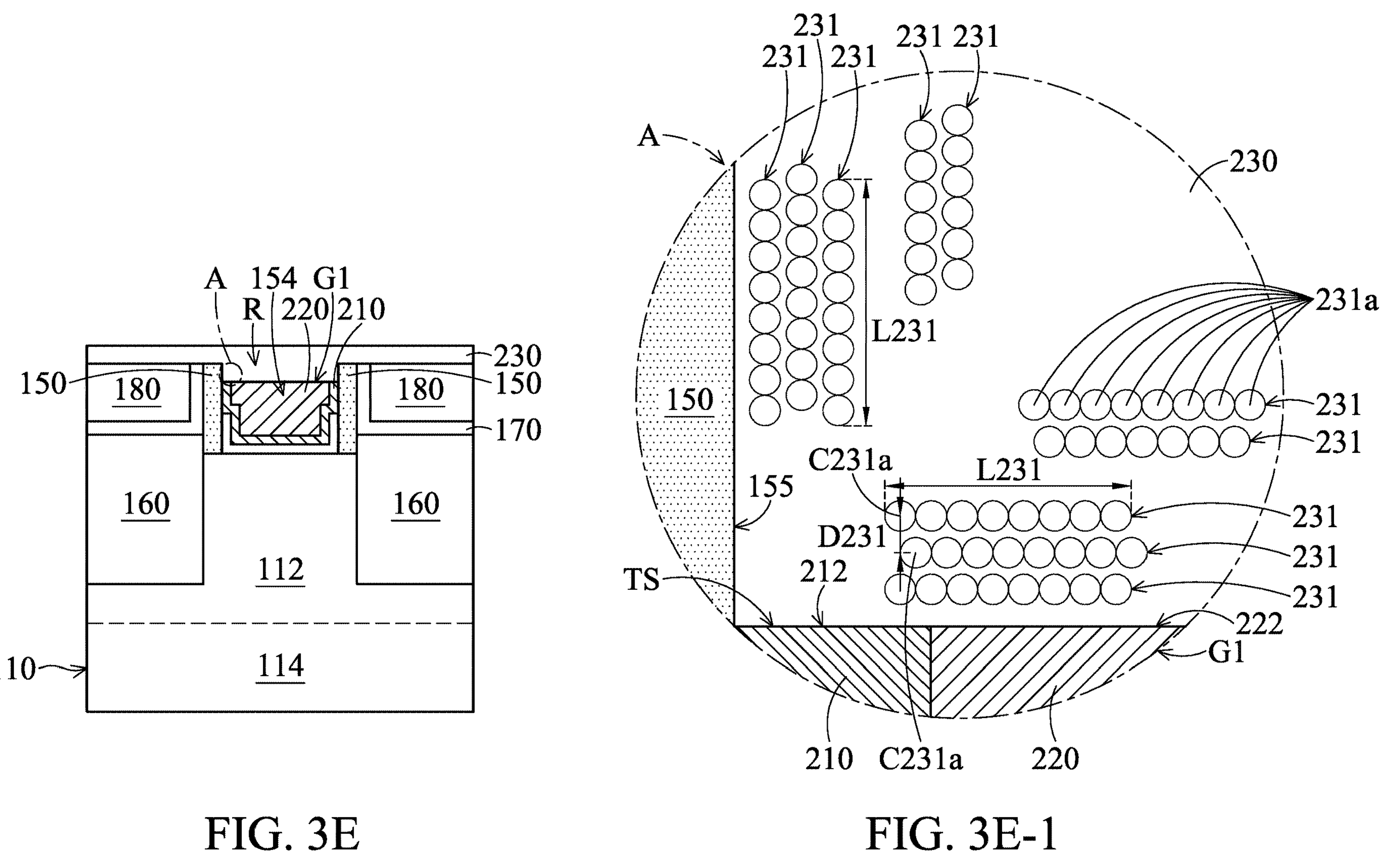

As shown in FIG. 3E, a top portion of the metal gate stack G1 is removed to form a recess R, in accordance with some embodiments. The recess R is surrounded by the spacer 150 and the metal gate stack G1, in accordance with some embodiments. As shown in FIG. 3E, a cap layer 230 is formed in the recess R and over the metal gate stack G1, the spacer 150, the etch stop layer 170, and the dielectric layer 180, in accordance with some embodiments.

The cap layer 230 is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_3(CH_3)_3$, the like, or another suitable material with a hexagonal ring structure, in accordance with some embodiments.

Since the hexagonal ring structure is a 2D (2 dimensions) structure, the cap layer 230 tends to have a layered structure, in accordance with some embodiments. FIG. 3E-1 is an enlarged view of a region A of the semiconductor device structure of FIG. 3E, in accordance with some embodiments.

As shown in FIGS. 3E and 3E-1, the cap layer 230 has layers 231, in accordance with some embodiments. In some embodiments, some layers 231 are substantially parallel to a top surface TS of the metal gate stack G1 (or top surfaces 212 and 222 of the work function metal layer 210 and the gate electrode 220). In some other embodiments, some layers 231 are substantially parallel to an inner wall 155 of the spacer 150.

Each layer 231 includes a boron- and nitrogen-containing material having a hexagonal ring structure, in accordance with some embodiments. The layers 231 are monatomic layers, in accordance with some embodiments. Each layer 231 includes atoms 231*a*, in accordance with some embodiments. The atoms 231*a* include boron and nitrogen, in accordance with some embodiments. In some embodiments, the atoms 231*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the cap layer 230, in accordance with some embodiments. Therefore, the parasitic capacitance of a semiconductor device structure with the cap layer 230 is lowered, which improves the performance of the semiconductor device structure, in accordance with some embodiments. The dielectric constant of the cap layer 230 ranges from about 1.8 to about 2, in accordance with some embodiments.

Furthermore, the hexagonal boron nitride and hexagonal boron carbon nitride are high density materials, which increases the density of the cap layer 230, in accordance with some embodiments. Therefore, the mechanical property of the cap layer 230 is improved, which improves the reliability of the semiconductor device structure with the cap layer 230, in accordance with some embodiments. The density of the cap layer 230 ranges from about 2.1 g/cm$^3$ to about 2.3 g/cm$^3$, in accordance with some embodiments.

The average length L231 of the layers 231 ranges from about 2 nm to about 10 nm, in accordance with some embodiments. The average spacing D231 between two adjacent layers 231 ranges from about 0.1 nm to about 0.5 nm, in accordance with some embodiments. The average spacing D231 is a distance between the centers C231*a* of the atoms 231*a* of two adjacent layers 231, in accordance with some embodiments.

The volume ratio of the layers 231 to the cap layer 230 ranges from about 60% to about 99%, in accordance with some embodiments. The atomic concentration of boron in the cap layer 230 ranges from about 40% to about 50%, in accordance with some embodiments. The atomic concentration of nitrogen in the cap layer 230 ranges from about 40% to about 50%, in accordance with some embodiments. The atomic concentration of carbon in the cap layer 230 ranges from about 0.1% to about 10%, in accordance with some embodiments. In some embodiments, the cap layer 230 has no carbon.

The cap layer 230 is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about 10$^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 231 to the cap layer 230 is too low to lower the dielectric constant of the cap layer 230, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the cap layer 230 in the recess R and over the metal gate stack G1, the spacer 150, the etch stop layer 170, and the dielectric layer 180; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

Figure 3G:
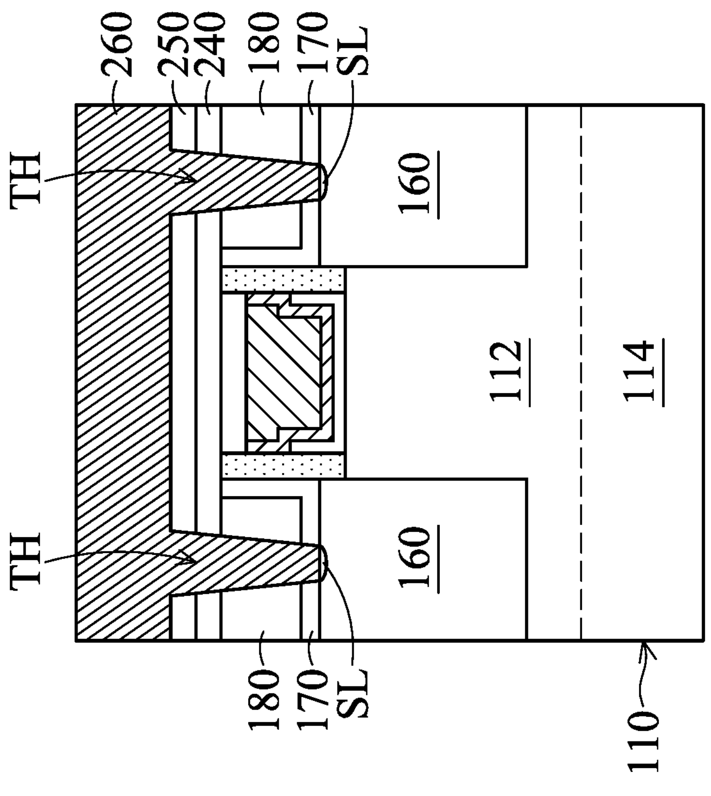
Figure 3F:
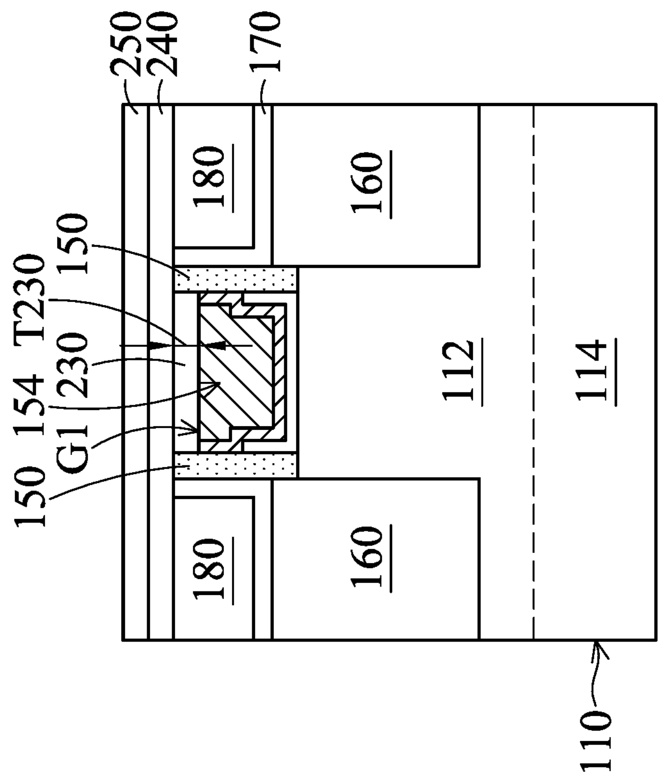

Thereafter, as shown in FIG. 3F, an etch stop layer 240 is formed over the etch stop layer 170, the dielectric layer 180, the spacer 150, and the cap layer 230, in accordance with some embodiments. The etch stop layer 240 is made of silicon nitride or another suitable material, in accordance with some embodiments.

The etch stop layer 240 is formed using a deposition process such as a physical vapor deposition (PVD) process, a chemical vapor deposition (CVD) process, an atomic layer deposition (ALD), or a combination thereof, in accordance with some embodiments.

As shown in FIG. 3F, a protective layer 250 is formed over the etch stop layer 240, in accordance with some embodiments. The protective layer 250 is configured to protect the etch stop layer 240 from being damaged during a subsequent pre-amorphized implantation (PAI) process, in accordance with some embodiments. The protective layer 250 includes, for example, a plasma-enhanced oxide (PEOX) layer.

Afterwards, as shown in FIG. 3G, portions of the dielectric layer 180, the etch stop layers 170 and 240, and the protective layer 250 are removed to form through holes TH passing through the dielectric layer 180, the etch stop layers 170 and 240, and the protective layer 250, in accordance with some embodiments. The through holes TH expose the source/drain structures 160, respectively, in accordance with some embodiments. In some embodiments, the removal process includes a photolithography process and an etching process.

In some embodiments, a pre-amorphized implantation (PAI) process is performed to reduce the dopant channeling effect and enhance dopant activation. In some embodiments, silicon, germanium or carbon is used. In some other embodiments, inert gases, such as neon, argon, krypton, xenon, and/or radon, are used. Portions of the source/drain structures 160, exposed by the through holes TH, are turned into an amorphous state as a result of the PAI process, in accordance with some embodiments.

As shown in FIG. 3G, a salicidation (self-aligned silicidation) process is performed to form metal silicide structures SL on/in the source/drain structures 160, respectively, in accordance with some embodiments. The metal silicide structures SL are made of nickel silicide, in accordance with some embodiments.

In some embodiments, the metal silicide structures SL are made of a silicide material of a suitable metal material. The suitable metal material may include cobalt (Co), nickel (Ni), platinum (Pt), titanium (Ti), ytterbium (Yb), molybdenum (Mo), erbium (Er), or a combination thereof. In some embodiments, the salicidation process is optional.

As shown in FIG. 3G, a conductive layer 260 is deposited over the protective layer 250 to fill the through holes TH, in accordance with some embodiments. The conductive layer 260 is connected to the metal silicide structures SL, in accordance with some embodiments. The conductive layer 260 is made of, for example, tungsten or another suitable conductive material, in accordance with some embodiments. The conductive layer 260 is formed by, for example, a chemical vapor deposition (CVD) process, an atomic layer deposition (ALD) process, or another suitable process.

Figures 1, 3H:
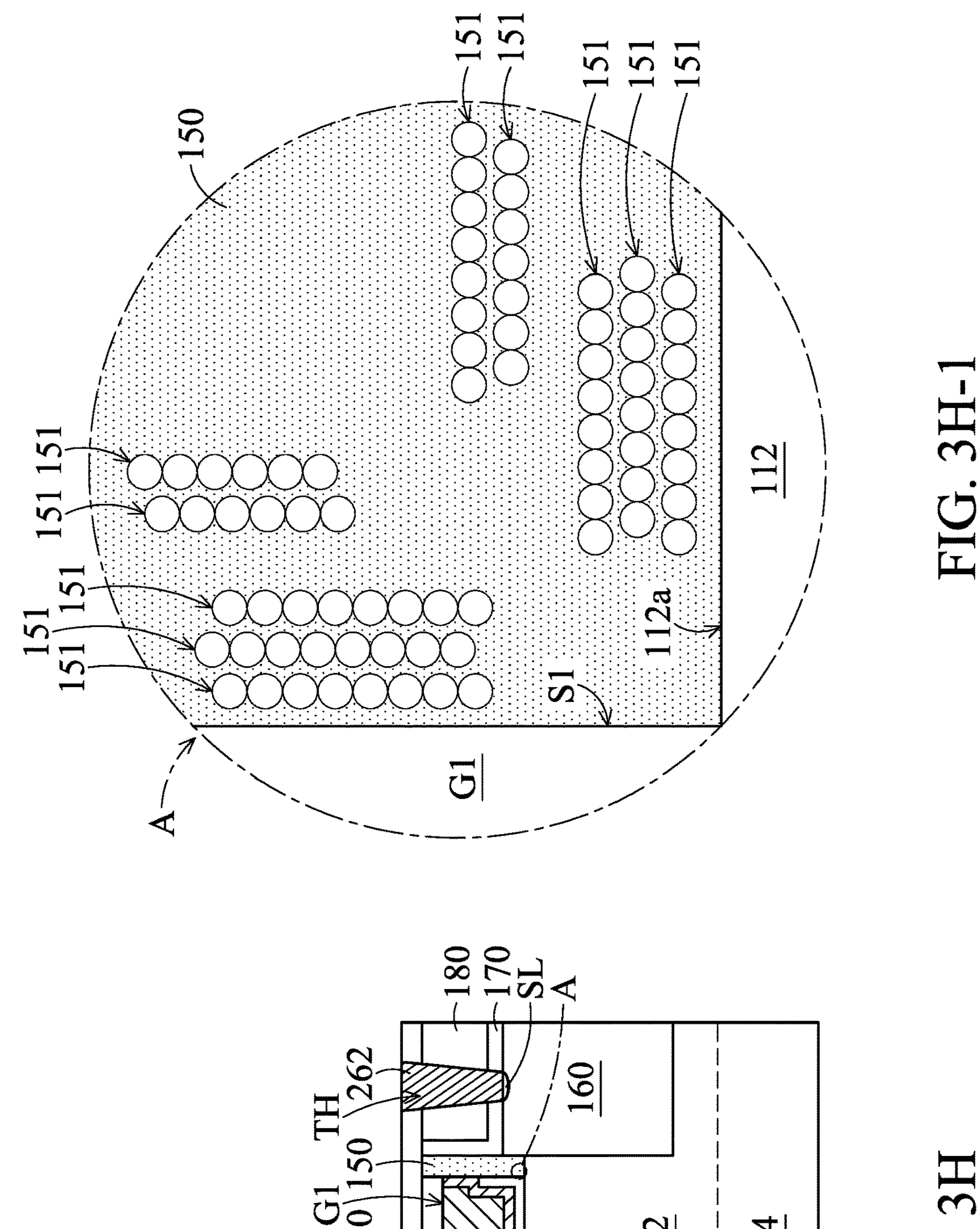

As shown in FIGS. 3G and 3H, the conductive layer 260 outside the through holes TH and the protective layer 250 are removed, in accordance with some embodiments. The removal process includes, for example, a chemical mechanical polishing (CMP) process.

After the removal process, the conductive layer 260 remaining in the through holes TH forms contact plugs 262, in accordance with some embodiments. The contact plugs 262 are electrically connected to the source/drain structures 160 through the metal silicide structures SL, in accordance with some embodiments. After the removal process, top surfaces 242 and 262*a* of the etch stop layer 240 and the contact plugs 262 are substantially level with each other, in accordance with some embodiments.

In this step, a semiconductor device structure 300 is substantially formed, in accordance with some embodiments. The semiconductor device structure 300 may be an n-type metal-oxide-semiconductor field-effect transistor (MOSFET) or a p-type MOSFET.

Since the dielectric constant of the spacer 150, the cap layer 230, and the etch stop layer 170 are reduced, the parasitic capacitance of the semiconductor device structure 300 is reduced, which improves the performance of the semiconductor device structure 300, in accordance with some embodiments.

Since the stability and the reliability of the spacer 150, the cap layer 230, and the etch stop layer 170 are improved, the stability and the reliability of the semiconductor device structure 300 are improved as well, in accordance with some embodiments.

FIG. 3H-1 is an enlarged view of a region A of the semiconductor device structure of FIG. 3H, in accordance with some embodiments. As shown in FIG. 3H-1, some layers 151 of the spacer 150 are substantially parallel to the sidewall S1 of the metal gate stack G1, in accordance with some embodiments. In some embodiments, some layers 151 are substantially parallel to the top surface 112*a* of the fin 112 of the substrate 110.

Figures 1, 4A:
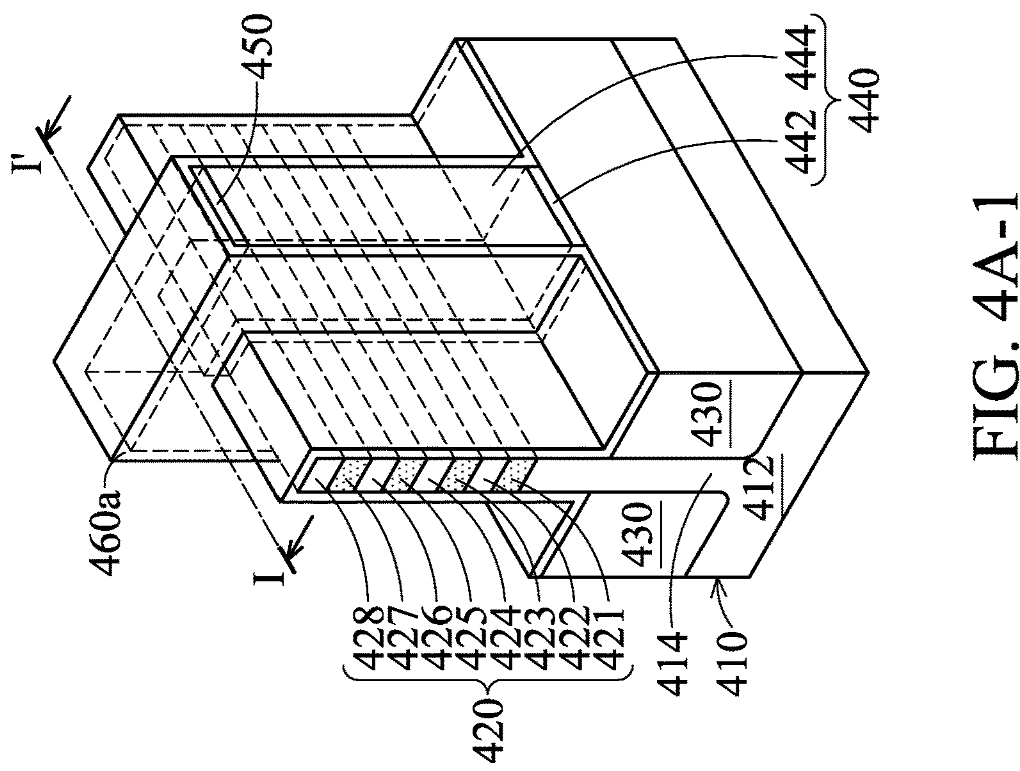
Figure 4A:
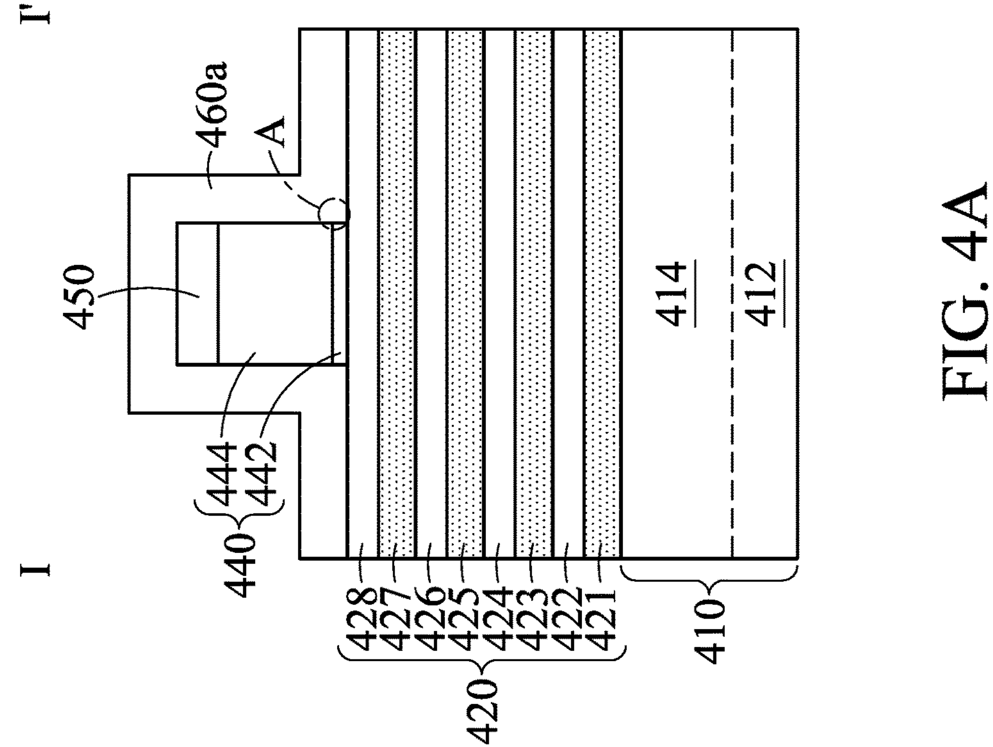
Figures 2, 4A:
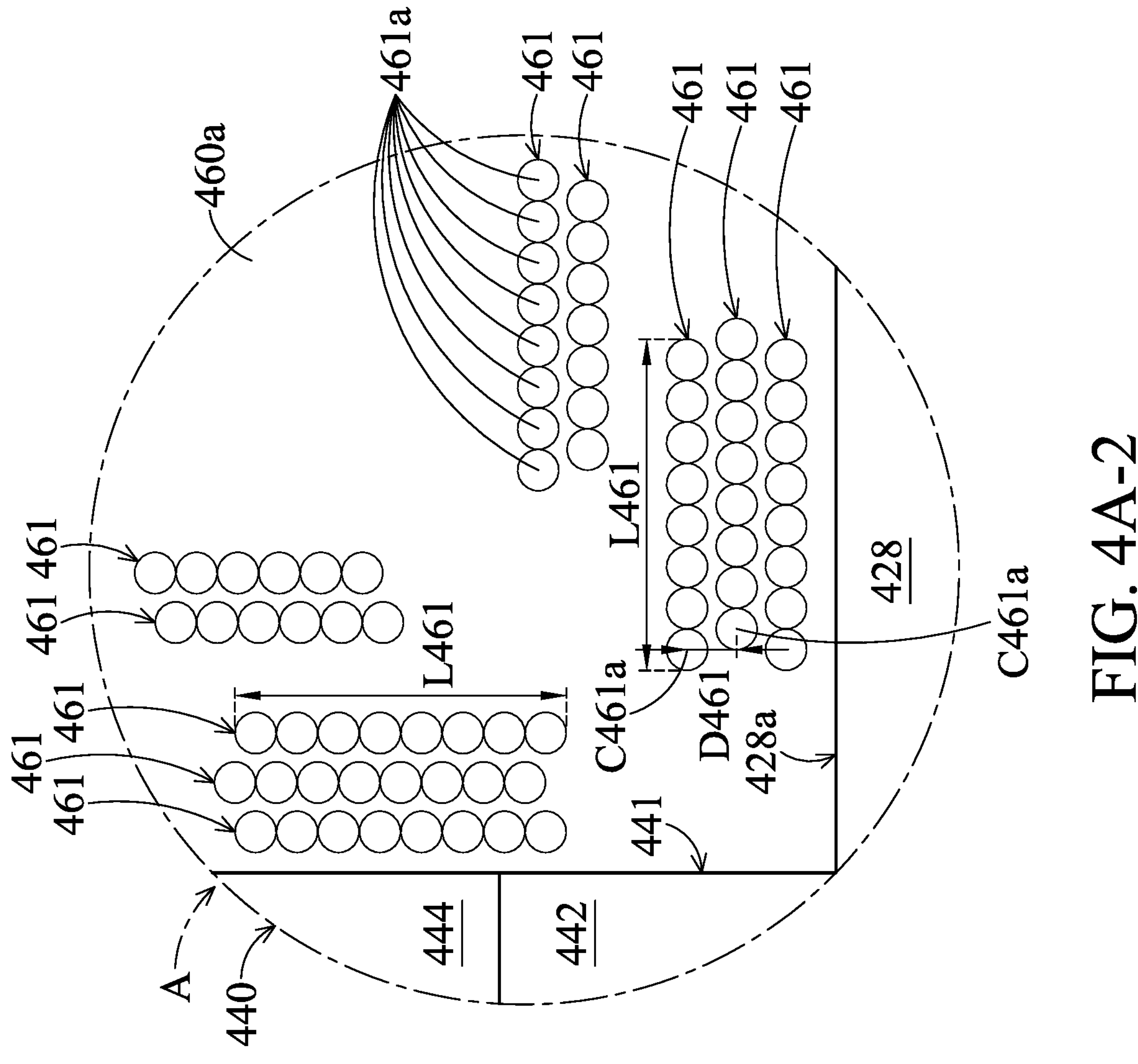

FIGS. 4A-4L are cross-sectional views of various stages of a process for forming a semiconductor device structure, in accordance with some embodiments. FIG. 4A-1 is a perspective view of the semiconductor device structure of FIG. 4A, in accordance with some embodiments.

As shown in FIGS. 4A and 4A-1, a substrate 410 is provided, in accordance with some embodiments. The substrate 410 has a base 412 and a fin 414 over the base 412, in accordance with some embodiments.

The substrate 410 includes, for example, a semiconductor substrate. The substrate 410 includes, for example, a semiconductor wafer (such as a silicon wafer) or a portion of a semiconductor wafer. In some embodiments, the substrate 410 is made of an elementary semiconductor material including silicon or germanium in a single crystal structure, a polycrystal structure, or an amorphous structure.

In some other embodiments, the substrate 410 is made of a compound semiconductor, such as silicon carbide, gallium arsenide, gallium phosphide, indium phosphide, indium arsenide, an alloy semiconductor, such as SiGe or GaAsP, or a combination thereof. The substrate 410 may also include multi-layer semiconductors, semiconductor on insulator (SOI) (such as silicon on insulator or germanium on insulator), or a combination thereof.

In some embodiments, isolation features (not shown) are formed in the substrate 410. The isolation features are used to define active regions and electrically isolate various device elements formed in and/or over the substrate 410 in the active regions. In some embodiments, the isolation features include shallow trench isolation (STI) features, local oxidation of silicon (LOCOS) features, other suitable isolation features, or a combination thereof.

As shown in FIGS. 4A and 4A-1, a nanostructure stack 420 is formed over the fin 414, in accordance with some embodiments. The nanostructure stack 420 includes nanostructures 421, 422, 423, 424, 425, 426, 427, and 428, in accordance with some embodiments.

The nanostructures 421, 422, 423, 424, 425, 426, 427, and 428 are sequentially stacked over the fin 414, in accordance with some embodiments. The nanostructures 421, 422, 423, 424, 425, 426, 427, and 428 include nanowires or nanosheets, in accordance with some embodiments.

The nanostructures 421, 423, 425, and 427 are all made of the same first material, in accordance with some embodiments. The first material is different from the material of the substrate 410, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 422, 424, 426, and 428 are all made of the same second material, in accordance with some embodiments. The second material is different from the first material, in accordance with some embodiments. The second material is the same as the material of the substrate 410, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIGS. 4A and 4A-1, an isolation layer 430 is formed over the base 412, in accordance with some embodiments. The fin 414 is partially embedded in the isolation layer 430, in accordance with some embodiments. The fin 414 is surrounded by the isolation layer 430, in accordance with some embodiments.

The isolation layer 430 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 430 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, or a combination thereof, in accordance with some embodiments.

As shown in FIGS. 4A and 4A-1, a gate stack 440 is formed over the nanostructure stack 420, in accordance with some embodiments. Specifically, the gate stack 440 is formed over the nanostructure stack 420, the fin 414, and the isolation layer 430, in accordance with some embodiments.

The gate stack 440 includes a gate dielectric layer 442 and a gate electrode 444, in accordance with some embodiments. The gate electrode 444 is over the gate dielectric layer 442, in accordance with some embodiments. The gate dielectric layer 442 is positioned between the gate electrode 444 and the nanostructure stack 420, in accordance with some embodiments. The gate dielectric layer 442 is also positioned between the gate electrode 444 and the fin 414, in accordance with some embodiments. The gate dielectric layer 442 is positioned between the gate electrode 444 and the isolation layer 430, in accordance with some embodiments.

The gate dielectric layer 442 is made of an oxide-containing material such as silicon oxide, in accordance with some embodiments. The gate dielectric layer 442 is formed using a chemical vapor deposition process and an etching process, in accordance with some embodiments. The gate electrode 444 is made of a semiconductor material such as polysilicon, in accordance with some embodiments. The gate electrode 444 is formed using a chemical vapor deposition process and an etching process, in accordance with some embodiments.

As shown in FIGS. 4A and 4A-1, a mask layer 450 is formed over the gate stack 440, in accordance with some embodiments. As shown in FIGS. 4A and 4A-1, a spacer layer 460*a* is formed over the mask layer 450, the gate stack 440, the nanostructure stack 420, the fin 414, and the isolation layer 430, in accordance with some embodiments.

The spacer layer 460*a* is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Since the hexagonal ring structure is a 2D (2 dimensions) structure, the spacer layer 460*a* tends to have a layered structure, in accordance with some embodiments. FIG. 4A-2 is an enlarged view of a region A of the semiconductor device structure of FIG. 4A, in accordance with some embodiments.

As shown in FIGS. 4A and 4A-2, the spacer layer 460*a* has layers 461, in accordance with some embodiments. In some embodiments, some layers 461 are substantially parallel to the sidewall 441 of the gate stack 440. In some other embodiments, some layers 461 are substantially parallel to a top surface 428*a* of the nanostructure 428 of the nanostructure stack 420.

Each layer 461 includes a boron- and nitrogen-containing material having a hexagonal ring structure, in accordance with some embodiments. The layers 461 are monatomic layers, in accordance with some embodiments. Each layer 461 includes atoms 461*a*, in accordance with some embodiments. The atoms 461*a* include boron and nitrogen, in accordance with some embodiments. In some embodiments, the atoms 461*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the spacer layer 460*a*, in accordance with some embodiments. Therefore, the parasitic capacitance of a semiconductor device structure with the spacer layer 460*a* is lowered, which improves the performance of the semiconductor device structure, in accordance with some embodiments. The dielectric constant of the spacer layer 460*a* ranges from about 1.8 to about 2, in accordance with some embodiments.

Furthermore, the hexagonal boron nitride and hexagonal boron carbon nitride are high density materials, which increases the density of the spacer layer 460*a*, in accordance with some embodiments. Therefore, the mechanical property of the spacer layer 460*a* is improved, which improves the reliability of the semiconductor device structure with the spacer layer 460*a*, in accordance with some embodiments. The density of the spacer layer 460*a* ranges from about 2.1 $g/cm^3$ to about 2.3 $g/cm^3$, in accordance with some embodiments.

The average length L461 of the layers 461 ranges from about 2 nm to about 10 nm, in accordance with some embodiments. The average spacing D461 between two adjacent layers 461 ranges from about 0.1 nm to about 0.5 nm, in accordance with some embodiments. The average spacing D461 is a distance between the centers C461*a* of the atoms 461*a* of two adjacent layers 461, in accordance with some embodiments.

The volume ratio of the layers 461 to the spacer layer 460*a* ranges from about 60% to about 99%, in accordance with some embodiments. The atomic concentration of boron in the spacer layer 460*a* ranges from about 40% to about 50%, in accordance with some embodiments. The atomic concentration of nitrogen in the spacer layer 460*a* ranges from about 40% to about 50%, in accordance with some embodiments. The atomic concentration of carbon in the spacer layer 460*a* ranges from about 0.1% to about 10%, in accordance with some embodiments. In some embodiments, the spacer layer 460*a* has no carbon.

The spacer layer 460*a* is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 461 to the spacer layer 460*a* is too low to lower the dielectric constant of the spacer layer 460*a*, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the spacer layer 460*a* over the mask layer 450, the gate stack 440, the nanostructure stack 420, the fin 414, and the isolation layer 430; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

Figures 1, 4B:
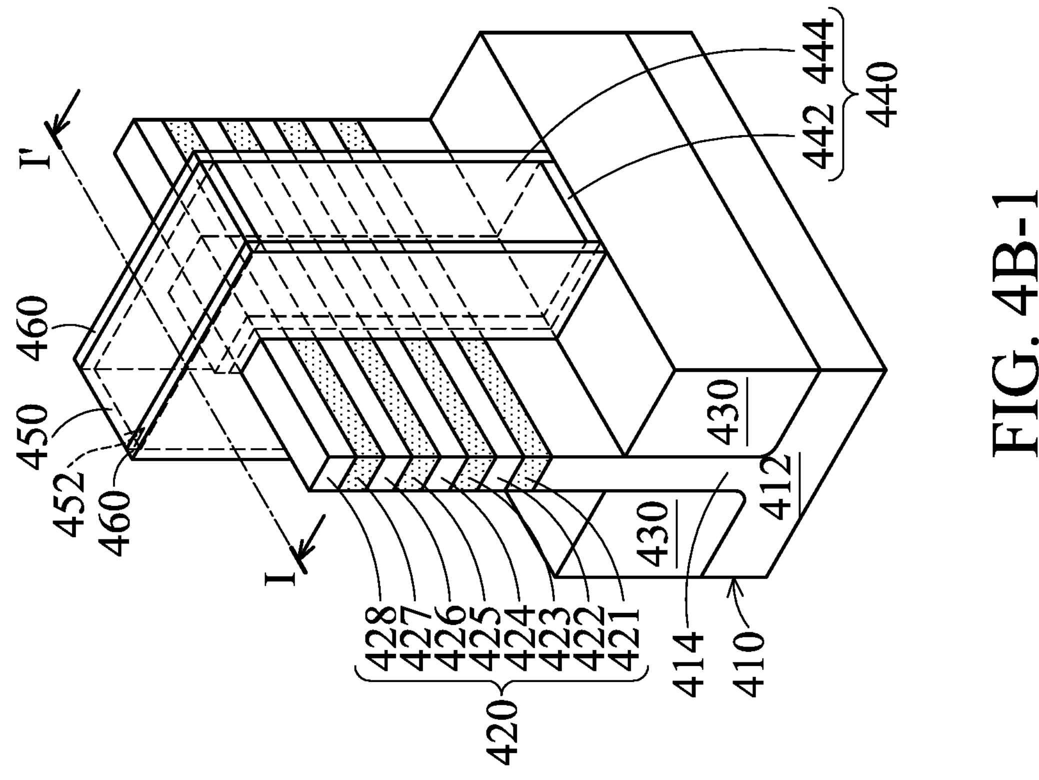
Figure 4B:
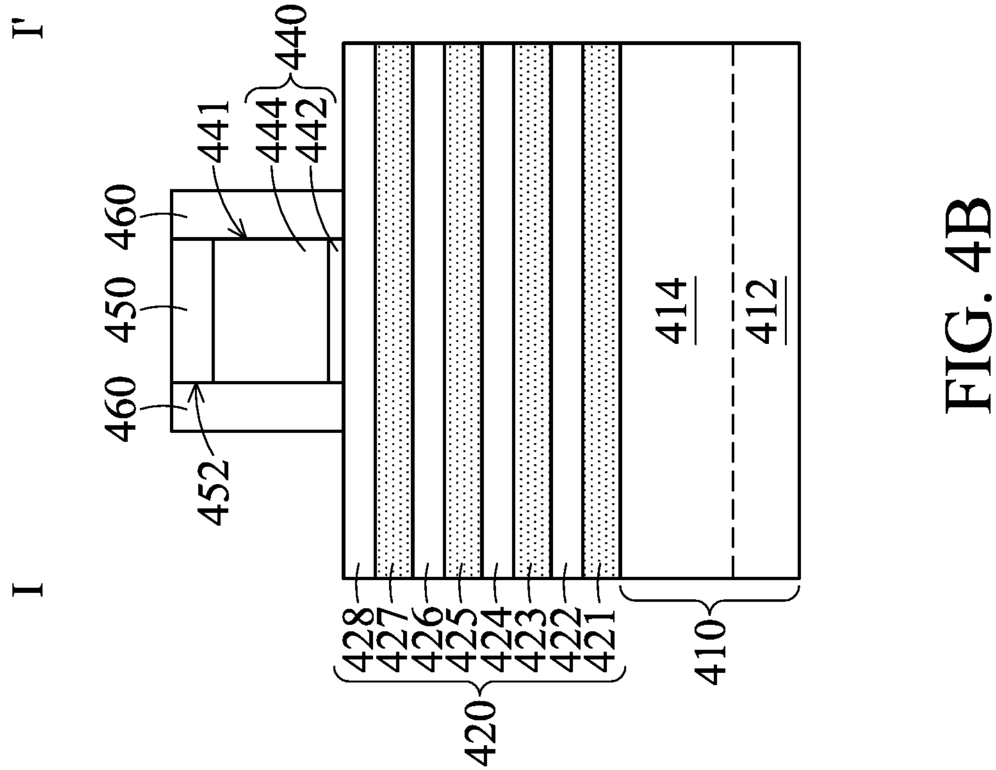

FIG. 4B-1 is a perspective view of the semiconductor device structure of FIG. 4B, in accordance with some embodiments. As shown in FIGS. 4A, 4B and 4B-1, portions of the spacer layer 460*a* are removed, in accordance with some embodiments. After the removal process, the spacer layer 460*a* remains over the sidewalls 441 of the gate stack 440 and the sidewalls 452 of the mask layer 450, in accordance with some embodiments. The remaining spacer layer 460*a* forms a spacer 460, in accordance with some embodiments. The removal processes includes an anisotropic etching process, in accordance with some embodiments.

Figure 4C:
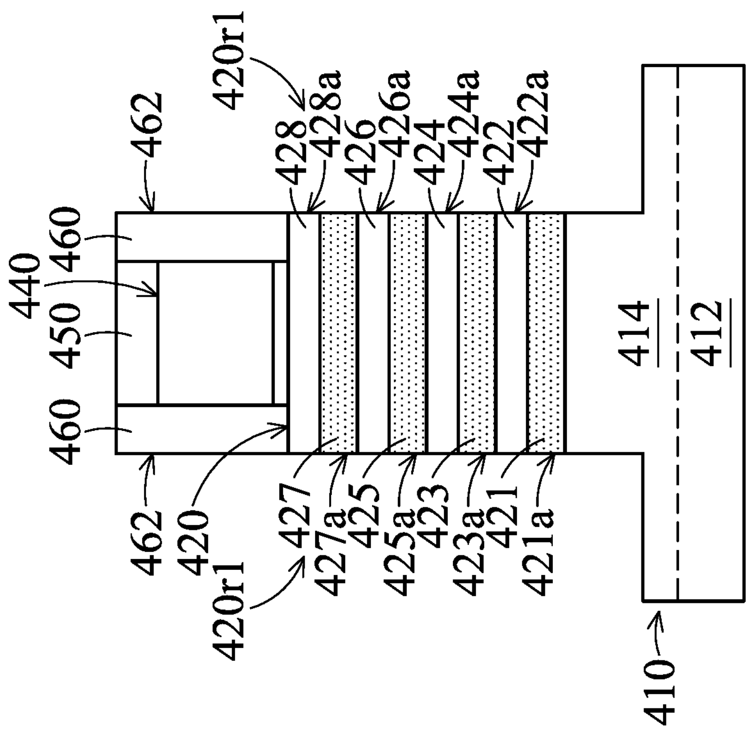

As shown in FIG. 4C, end portions of the nanostructures 421, 422, 423, 424, 425, 426, 427, and 428, which are not covered by the gate stack 440 and the spacer 460, are removed, in accordance with some embodiments. The removal process forms trenches 420*r*1 in the nanostructure stack 420 and the fin 414, in accordance with some embodiments.

As shown in FIG. 4C, sidewalls 421*a*, 422*a*, 423*a*, 424*a*, 425*a*, 426*a*, 427*a* and 428*a* of the nanostructures 421, 422, 423, 424, 425, 426, 427 and 428 are substantially aligned with (or substantially coplanar with) sidewalls 462 of the spacer 460 over the nanostructure stack 420, in accordance with some embodiments.

The removal process includes an etching process, in accordance with some embodiments. The etching process includes an anisotropic etching process such as a dry etching process, in accordance with some embodiments.

Figures 1, 4D:
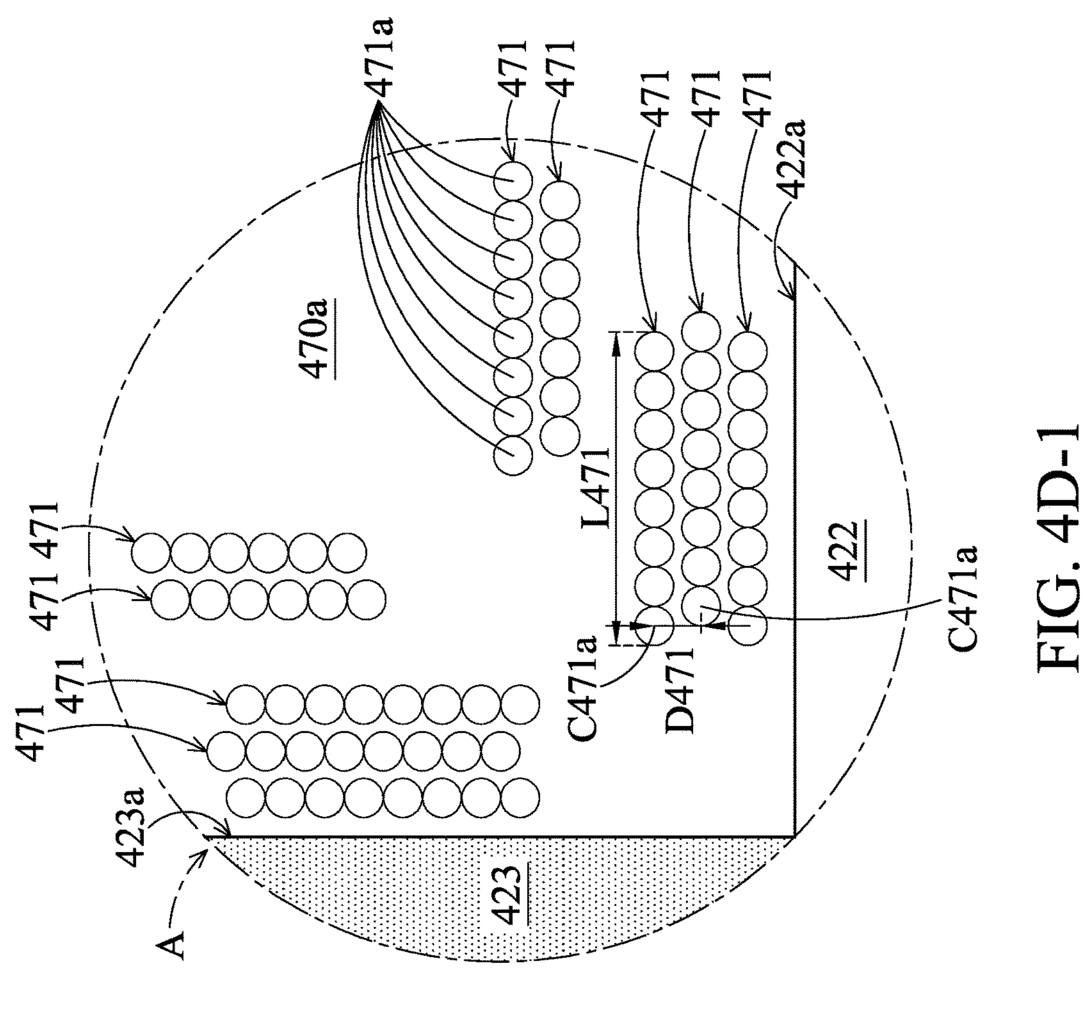
Figure 4D:
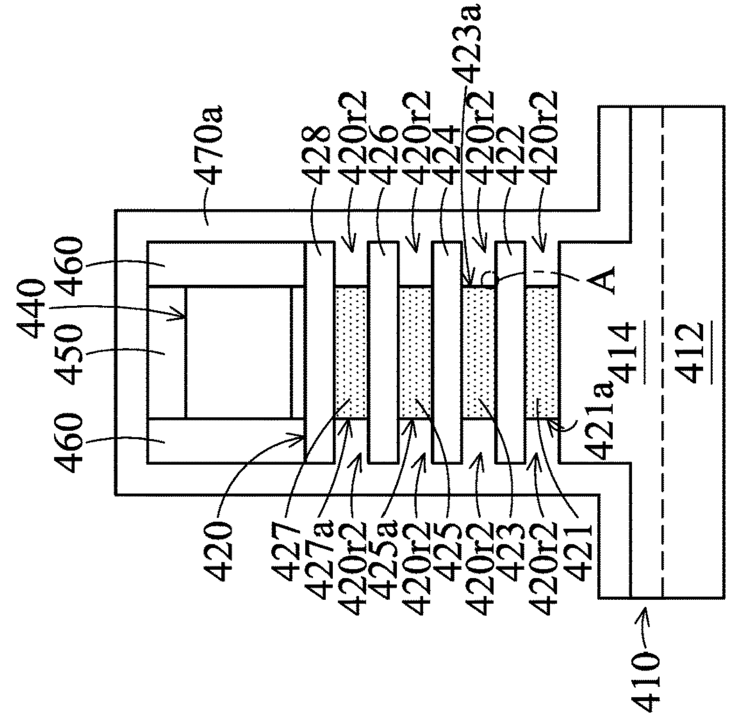

As shown in FIG. 4D, portions of the nanostructures 421, 423, 425, and 427 are removed through the trenches 420*r*1 to form recesses 420*r*2 in the nanostructure stack 420, in accordance with some embodiments. The recesses 420*r*2 are between the fin 414 and the nanostructure 422, 424, 426, and 428, in accordance with some embodiments. The removal process includes an etching process such as a dry etching process or a wet etching process, in accordance with some embodiments.

As shown in FIG. 4D, an inner spacer layer 470*a* is formed in the recess 420*r*2 and over the sidewalls 421*a*, 423*a*, 425*a* and 427*a* of the nanostructures 421, 423, 425, and 427, in accordance with some embodiments. The inner spacer layer 470*a* is in direct contact with the sidewalls 421*a*, 423*a*, 425*a* and 427*a*, in accordance with some embodiments.

The inner spacer layer 470*a* is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Since the hexagonal ring structure is a 2D (2 dimensions) structure, the inner spacer layer 470*a* tends to have a layered structure, in accordance with some embodiments. FIG. 4D-1 is an enlarged view of a region A of the semiconductor device structure of FIG. 4D, in accordance with some embodiments.

As shown in FIGS. 4D and 4D-1, the inner spacer layer 470*a* has layers 471, in accordance with some embodiments. In some embodiments, some layers 471 are substantially parallel to a sidewall 423*a* of the nanostructure 423. In some other embodiments, some layers 471 are substantially parallel to a top surface 422*a* of the nanostructure 422.

Each layer 471 includes a boron- and nitrogen-containing material having a hexagonal ring structure, in accordance with some embodiments. The layers 471 are monatomic layers, in accordance with some embodiments. Each layer 471 includes atoms 471*a*, in accordance with some embodiments. The atoms 471*a* include boron and nitrogen, in accordance with some embodiments. In some embodiments, the atoms 471*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the inner spacer layer 470*a*, in accordance with some embodiments. Therefore, the parasitic capacitance of a semiconductor device structure with the inner spacer layer 470*a* is lowered, which improves the performance of the semiconductor device structure, in accordance with some embodiments. The dielectric constant of the inner spacer layer 470*a* ranges from about 1.8 to about 2, in accordance with some embodiments.

Furthermore, the hexagonal boron nitride and hexagonal boron carbon nitride are high density materials, which increases the density of the inner spacer layer 470*a*, in accordance with some embodiments. Therefore, the mechanical property of the inner spacer layer 470*a* is improved, which improves the reliability of the semiconductor device structure with the inner spacer layer 470*a*, in accordance with some embodiments. The density of the inner spacer layer 470*a* ranges from about 2.1 $g/cm^3$ to about 2.3 $g/cm^3$, in accordance with some embodiments.

The average length L471 of the layers 471 ranges from about 2 nm to about 10 nm, in accordance with some embodiments. The average spacing D471 between two adjacent layers 471 ranges from about 0.1 nm to about 0.5 nm, in accordance with some embodiments. The average spacing D471 is a distance between the centers C471*a* of the atoms 471*a* of two adjacent layers 471, in accordance with some embodiments.

The volume ratio of the layers 471 to the inner spacer layer 470*a* ranges from about 60% to about 99%, in accordance with some embodiments. The atomic concentration of boron in the inner spacer layer 470*a* ranges from about 40% to about 50%, in accordance with some embodiments. The atomic concentration of nitrogen in the inner spacer layer 470*a* ranges from about 40% to about 50%, in accordance with some embodiments. The atomic concentration of carbon in the inner spacer layer 470*a* ranges from about 0.1% to about 10%, in accordance with some embodiments. In some embodiments, the inner spacer layer 470*a* has no carbon.

The inner spacer layer 470*a* is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 471 to the inner spacer layer 470*a* is too low to lower the dielectric constant of the inner spacer layer 470*a*, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the inner spacer layer 470*a* over the gate stack G, the fin 112, and the isolation layer 120; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

Figure 4E:
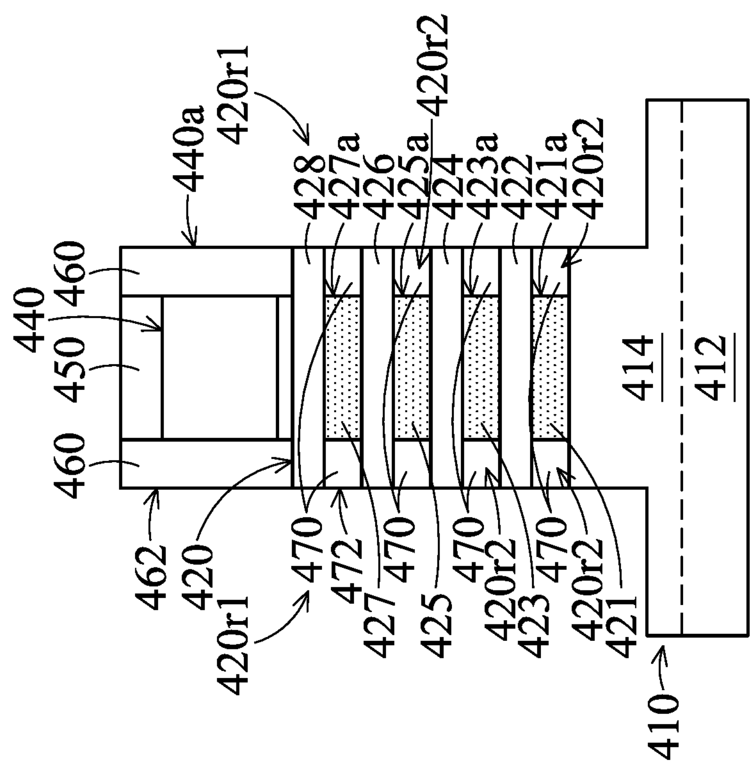

As shown in FIG. 4E, portions of the inner spacer layer 470*a* outside of the recesses 420*r*2 are removed, in accordance with some embodiments. The remaining inner spacer layer 470*a* forms inner spacers 470, in accordance with some embodiments. As shown in FIG. 4E, sidewalls 472 of the inner spacers 470 are substantially aligned with (or substantially coplanar with) the sidewalls 462 of the spacer 460, in accordance with some embodiments.

Figures 1, 4F:
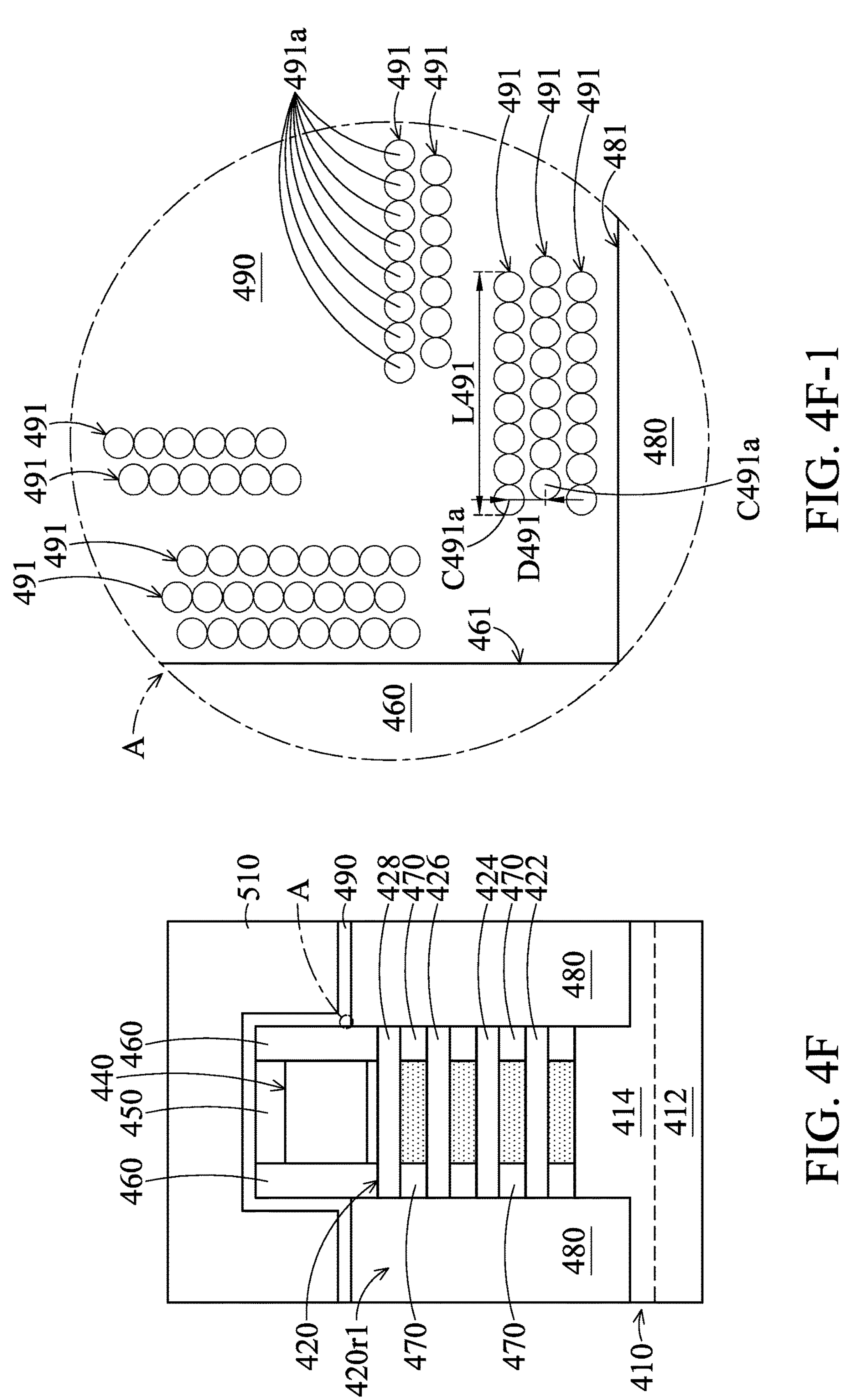

As shown in FIG. 4F, source/drain structures 480 are formed in the trenches 420*r*1, in accordance with some embodiments. The source/drain structures 480 are used to be a source structure and a drain structure, in accordance with some embodiments.

The nanostructures 422, 424, 426 and 428 are between the source/drain structures 480, in accordance with some embodiments. The source/drain structures 480 are in direct contact with the nanostructures 422, 424, 426 and 428, the spacer 460, the inner spacers 470, and the substrate 410, in accordance with some embodiments.

In some embodiments, the source/drain structures 480 are made of a semiconductor material (e.g., silicon or silicon carbide). The source/drain structures 480 are doped with N-type dopants, such as the Group VA element, in accordance with some embodiments. The Group VA element includes phosphor (P), antimony (Sb), or another suitable Group VA material. The source/drain structures 480 are formed using an epitaxial process, in accordance with some embodiments.

As shown in FIG. 4F, an etch stop layer 490 is formed over the source/drain structures 480, the spacer 460, and the mask layer 450, in accordance with some embodiments. The etch stop layer 490 is formed using a precursor, in accordance with some embodiments. The precursor includes a boron- and nitrogen-containing material, in accordance with some embodiments.

The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Since the hexagonal ring structure is a 2D (2 dimensions) structure, the etch stop layer 490 tends to have a layered structure, in accordance with some embodiments. FIG. 4F-1 is an enlarged view of a region A of the semiconductor device structure of FIG. 4F, in accordance with some embodiments.

As shown in FIGS. 4F and 4F-1, the etch stop layer 490 has layers 491, in accordance with some embodiments. In some embodiments, some layers 491 are substantially parallel to the sidewall 461 of the spacer 460. In some other embodiments, some layers 491 are substantially parallel to the top surface 481 of the source/drain structure 480.

Each layer 491 includes a boron- and nitrogen-containing material having a hexagonal ring structure, in accordance with some embodiments. The layers 491 are monatomic layers, in accordance with some embodiments. Each layer 491 includes atoms 491*a*, in accordance with some embodiments. The atoms 491*a* include boron and nitrogen, in accordance with some embodiments. In some embodiments, the atoms 491*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the etch stop layer 490, in accordance with some embodiments. Therefore, the parasitic capacitance of a semiconductor device structure with the etch stop layer 490 is lowered, which improves the performance of the semiconductor device structure, in accordance with some embodiments. The dielectric constant of the etch stop layer 490 ranges from about 1.8 to about 2, in accordance with some embodiments.

Furthermore, the hexagonal boron nitride and hexagonal boron carbon nitride are high density materials, which increases the density of the etch stop layer 490, in accordance with some embodiments. Therefore, the mechanical property of the etch stop layer 490 is improved, which improves the reliability of the semiconductor device structure with the etch stop layer 490, in accordance with some embodiments. The density of the etch stop layer 490 ranges from about 2.1 $g/cm^3$ to about 2.3 $g/cm^3$, in accordance with some embodiments.

The average length L491 of the layers 491 ranges from about 2 nm to about 10 nm, in accordance with some embodiments. The average spacing D491 between two adjacent layers 491 ranges from about 0.1 nm to about 0.5 nm, in accordance with some embodiments. The average spacing D491 is a distance between the centers C491*a* of the atoms 491*a* of two adjacent layers 491, in accordance with some embodiments.

The volume ratio of the layers 491 to the etch stop layer 490 ranges from about 60% to about 99%, in accordance with some embodiments. The atomic concentration of boron in the etch stop layer 490 ranges from about 40% to about 50%, in accordance with some embodiments. The atomic concentration of nitrogen in the etch stop layer 490 ranges from about 40% to about 50%, in accordance with some embodiments. The atomic concentration of carbon in the etch stop layer 490 ranges from about 0.1% to about 10%, in accordance with some embodiments. In some embodiments, the etch stop layer 490 has no carbon.

The etch stop layer 490 is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 491 to the etch stop layer 490 is too low to lower the dielectric constant of the etch stop layer 490, in accordance with some embodiments. The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the etch stop layer 490 over the source/drain structures 480, the spacer 460, and the mask layer 450; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

As shown in FIG. 4F, a dielectric layer 510 is formed over the etch stop layer 490, in accordance with some embodiments. The dielectric layer 510 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 510 is formed by a deposition process (e.g., a chemical vapor deposition process) and a planarization process (e.g., a chemical mechanical polishing process), in accordance with some embodiments.

Figure 4H:
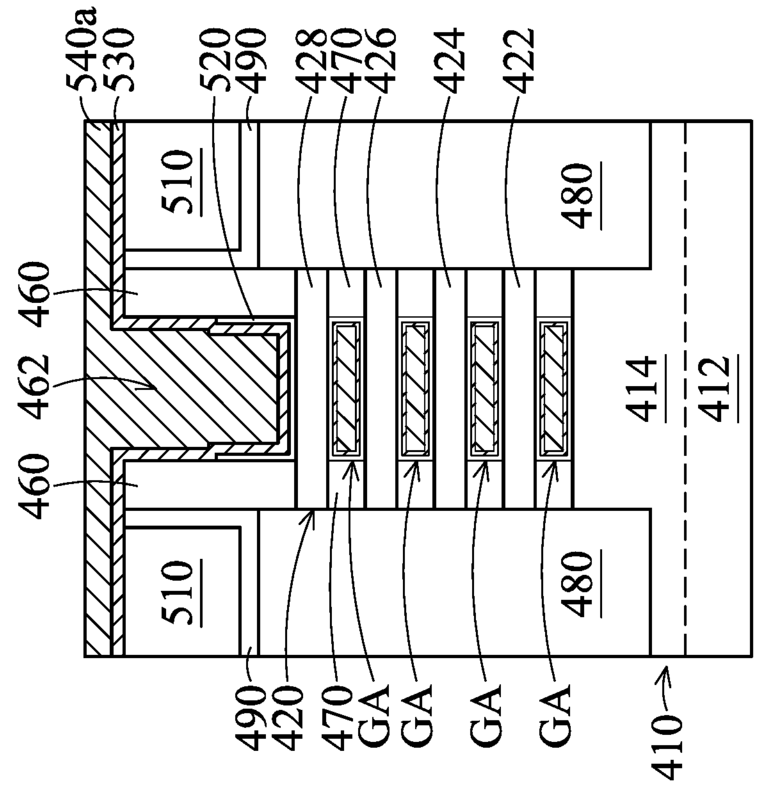
Figure 4G:
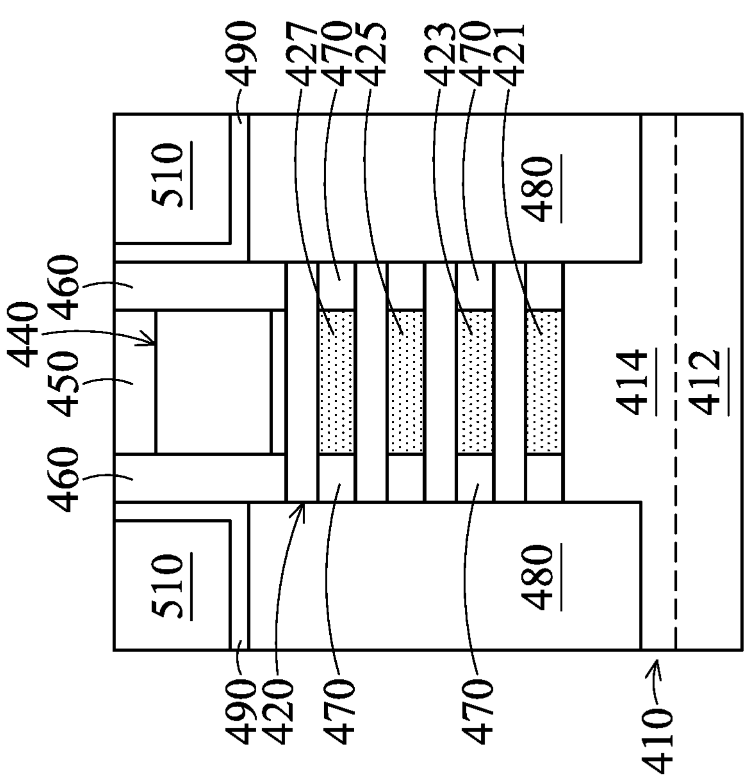

As shown in FIGS. 4F and 4G, upper portions of the etch stop layer 490 and the dielectric layer 510 are removed, in accordance with some embodiments. The removal process includes a chemical mechanical polishing process, in accordance with some embodiments.

As shown in FIG. 4H, the gate stack 440 and the mask layer 450 are removed, in accordance with some embodiments. The removal process forms trench 462 in the spacer 460, in accordance with some embodiments. As shown in FIGS. 4G and 4H, the nanostructures 421, 423, 425, and 427 are removed through the trench 462, in accordance with some embodiments.

The removal process for removing the gate stack 440, the mask layer 450 and the nanostructures 421, 423, 425, and 427 includes an etching process such as a wet etching process or a dry etching process, in accordance with some embodiments.

As shown in FIG. 4H, a gate dielectric layer 520 is formed over the nanostructures 422, 424, 426, and 428, the fin 414, the spacer 460, and the inner spacers 470, in accordance with some embodiments. The gate dielectric layer 520 surrounds the nanostructures 422, 424, 426, and 428, in accordance with some embodiments.

The gate dielectric layer 520 conformally covers the nanostructures 422, 424, 426, and 428, the spacer 460, and the inner spacers 470, in accordance with some embodiments. The gate dielectric layer 520 is made of a high-K material, such as $HfO_2$, $La_2O_3$, CaO, $ZrO_2$, $HfZrO_2$, or $Al_2O_3$, in accordance with some embodiments. The gate dielectric layer 520 is formed using an atomic layer deposition process or another suitable process.

As shown in FIG. 4H, a work function metal layer 530 is conformally formed over the gate dielectric layer 520, in accordance with some embodiments. The work function metal layer 530 provides a desired work function for transistors to enhance device performance including improved threshold voltage. In the embodiments of forming an NMOS transistor, the work function metal layer 530 can be a metal capable of providing a work function value suitable for the device, such as equal to or less than about 4.5 eV.

The work function metal layer 530 is made of metal, metal carbide, metal nitride, or a combination thereof, in accordance with some embodiments. For example, the work function metal layer 530 is made of tantalum, hafnium carbide, zirconium carbide, tantalum nitride, or a combination thereof.

In the embodiments of forming a PMOS transistor, the work function metal layer 530 can be a metal capable of providing a work function value suitable for the device, such as equal to or greater than about 4.8 eV.

The work function metal layer 530 is made of metal, metal carbide, metal nitride, another suitable material, or a combination thereof, in accordance with some embodiments. For example, the work function metal layer 530 is made of titanium, titanium nitride, another suitable material, or a combination thereof.

The work function metal layer 530 is formed using a deposition process, in accordance with some embodiments. The deposition process includes a physical vapor deposition process, a chemical vapor deposition process, an atomic layer deposition process, or a combination thereof, in accordance with some embodiments.

As shown in FIG. 4H, a gate electrode layer 540*a* is formed over the work function metal layer 530, in accordance with some embodiments. The trench 462 of the spacer 460 and gaps GA between the fin 414 and the nanostructures 422, 424, 426, and 428 are completely filled with the gate electrode layer 540*a*, in accordance with some embodiments.

The gate electrode layer 540*a* is made of metal, metal nitride, or metal carbide, in accordance with some embodiments. The gate electrode layer 540*a* is made of tungsten, titanium nitride, tantalum nitride, titanium aluminide, titanium carbide, or a combination thereof, in accordance with some embodiments. The gate electrode layer 540*a* is formed using an atomic layer deposition process or a chemical vapor deposition process, in accordance with some embodiments.

Figure 4I:
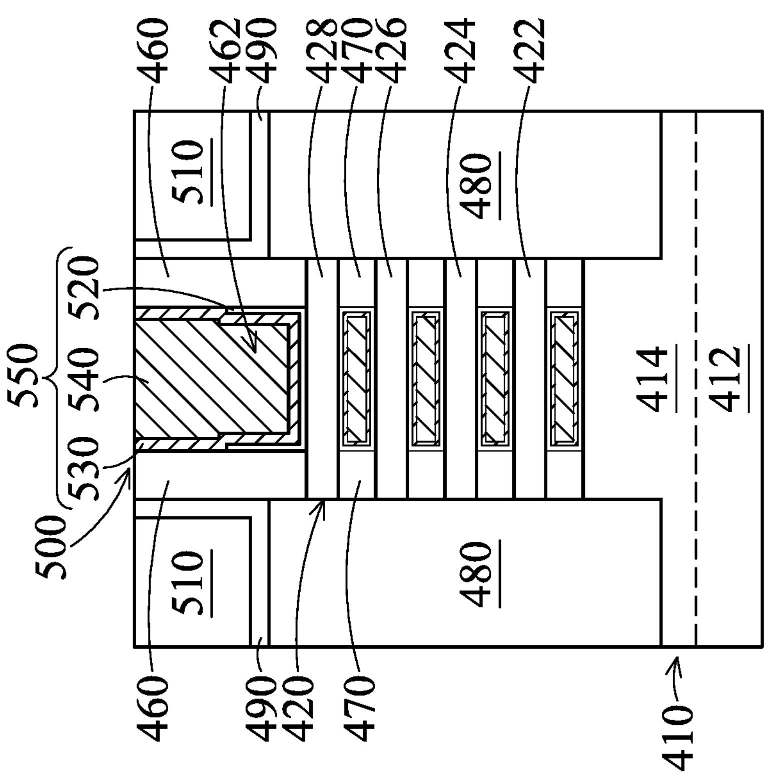

As shown in FIG. 4I, the work function metal layer 530 and the gate electrode layer 540*a* outside of the trench 462 are removed, in accordance with some embodiments. The gate electrode layer 540*a* remaining in the trench 462 forms a gate electrode layer 540, in accordance with some embodiments.

The gate electrode layer 540 surrounds the nanostructures 422, 424, 426, and 428, in accordance with some embodiments. The gate electrode layer 540, the work function metal layer 530, and the gate dielectric layer 520 thereunder together form a gate stack 550, in accordance with some embodiments.

In this step, a transistor 500 is substantially formed, in accordance with some embodiments. The transistor 500 includes the gate stack 550 and the source/drain structures 480, in accordance with some embodiments.

Figures 1, 4J:
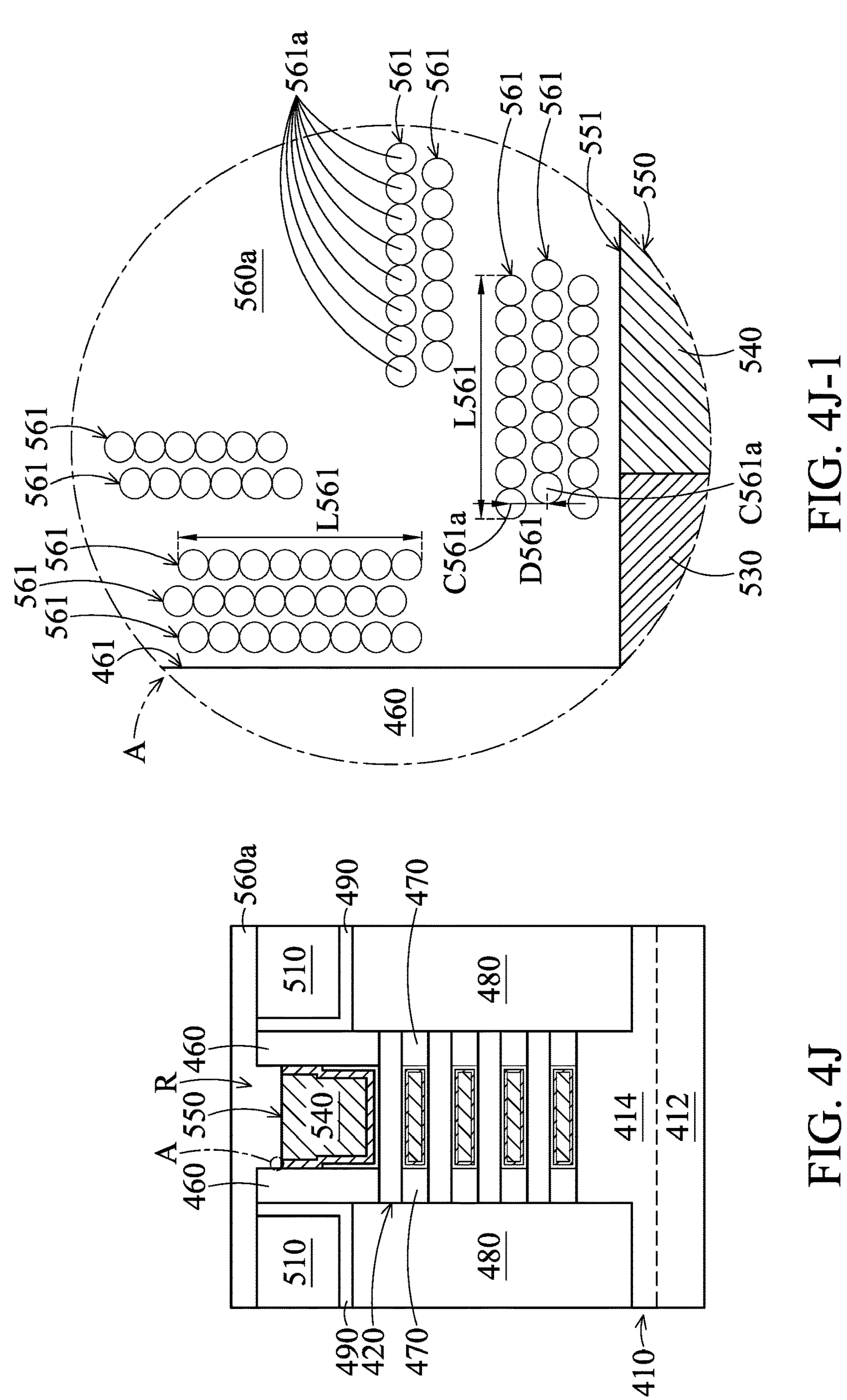

As shown in FIG. 4J, a top portion of the gate stack 550 is removed to form a recess R, in accordance with some embodiments. The recess R is surrounded by the gate stack 550 and the spacer 460, in accordance with some embodiments. As shown in FIG. 4J, a cap material layer 560*a* is formed in the recess R and over the spacer 460 and the dielectric layer 510, in accordance with some embodiments.

The cap material layer 560*a* is formed using a precursor, in accordance with some embodiments. The precursor includes a boron- and nitrogen-containing material, in accordance with some embodiments. The boron- and nitrogen-containing material has a hexagonal ring structure, in accordance with some embodiments. The boron- and nitrogen-containing material includes $B_3N_3H_6$, $B_3N_3H_5CH_3$, $B_3N_3H_5C_2H_5$, $B_3N_3H_3(CH_3)_3$, the like, or another suitable material with a hexagonal ring structure, in accordance with some embodiments.

Since the hexagonal ring structure is a 2D (2 dimensions) structure, the cap material layer 560*a* tends to have a layered structure, in accordance with some embodiments. FIG. 4J-1 is an enlarged view of a region A of the semiconductor device structure of FIG. 4J, in accordance with some embodiments.

As shown in FIGS. 4J and 4J-1, the cap material layer 560*a* has layers 561, in accordance with some embodiments. In some embodiments, some layers 561 are substantially parallel to the inner wall 461 of the spacer 460. In some other embodiments, some layers 561 are substantially parallel to a top surface 551 of the gate stack 550.

Each layer 561 includes a boron- and nitrogen-containing material having a hexagonal ring structure, in accordance with some embodiments. The layers 561 are monatomic layers, in accordance with some embodiments. Each layer 561 includes atoms 561*a*, in accordance with some embodiments. The atoms 561*a* include boron and nitrogen, in accordance with some embodiments. In some embodiments, the atoms 561*a* include boron, nitrogen, and carbon, in accordance with some embodiments.

Since both hexagonal boron nitride and hexagonal boron carbon nitride have a low dipole moment, hexagonal boron nitride and hexagonal boron carbon nitride are ultra-low-k materials, which lowers the dielectric constant of the cap material layer 560*a*, in accordance with some embodiments. Therefore, the parasitic capacitance of a semiconductor device structure with the cap material layer 560*a* is lowered, which improves the performance of the semiconductor device structure, in accordance with some embodiments. The dielectric constant of the cap material layer 560*a* ranges from about 1.8 to about 2, in accordance with some embodiments.

Furthermore, the hexagonal boron nitride and hexagonal boron carbon nitride are high density materials, which increases the density of the cap material layer 560*a*, in accordance with some embodiments. Therefore, the mechanical property of the cap material layer 560*a* is improved, which improves the reliability of the semiconductor device structure with the cap material layer 560*a*, in accordance with some embodiments. The density of the cap material layer 560*a* ranges from about 2.1 $g/cm^3$ to about 2.3 $g/cm^3$, in accordance with some embodiments.

The average length L561 of the layers 561 ranges from about 2 nm to about 10 nm, in accordance with some embodiments. The average spacing D561 between two adjacent layers 561 ranges from about 0.1 nm to about 0.5 nm, in accordance with some embodiments. The average spacing D561 is a distance between the centers C561*a* of the atoms 561*a* of two adjacent layers 561, in accordance with some embodiments.

The volume ratio of the layers 561 to the cap material layer 560*a* ranges from about 60% to about 99%, in accordance with some embodiments. The atomic concentration of boron in the cap material layer 560*a* ranges from about 40% to about 50%, in accordance with some embodiments. The atomic concentration of nitrogen in the cap material layer 560*a* ranges from about 40% to about 50%, in accordance with some embodiments. The atomic concentration of carbon in the cap material layer 560*a* ranges from about 0.1% to about 10%, in accordance with some embodiments. In some embodiments, the cap material layer 560*a* has no carbon.

The cap material layer 560*a* is formed using a deposition process, such as a chemical vapor deposition process (e.g., a plasma enhanced chemical vapor deposition process or an electron-enhanced chemical vapor deposition process) or an atomic layer deposition process (e.g., a plasma enhanced atomic layer deposition process or an electron-enhanced atomic layer deposition process), in accordance with some embodiments.

The electron beam energy of the deposition process ranges from about 50 eV to about 500 eV, in accordance with some embodiments. The plasma power of the deposition process ranges from about 50 W to about 500 W, in accordance with some embodiments. The plasma includes inductively coupled plasma (ICP), capacitively coupled plasma (CCP), or microwave plasma, in accordance with some embodiments. The deposition temperature of the deposition process ranges from about 100° C. to 800° C., in accordance with some embodiments. The deposition pressure of the deposition process ranges from about $10^{-3}$ torr to about 10 torr, in accordance with some embodiments.

The deposition rate of the deposition process ranges from about 0.02 nm/min to about 0.1 nm/min, in accordance with some embodiments. If the deposition rate is less than 0.02 nm/min, the process time is too long, in accordance with some embodiments. If the deposition rate is greater than 0.1 nm/min, the volume ratio of the layers 561 to the cap material layer 560*a* is too low to lower the dielectric constant of the cap material layer 560*a*, in accordance with some embodiments.

The process gas used in the deposition process includes nitrogen, hydrogen, and/or argon, in accordance with some embodiments. The carrier gas for carrying the precursor includes nitrogen, hydrogen, and/or argon, in accordance with some embodiments. During the deposition process, the substrate 110 is disposed in a chamber, in accordance with some embodiments.

One cycle of the deposition process includes: introducing the process gas into the chamber; igniting a plasma in the chamber; introducing the precursor and the carrier gas into the chamber through a tube connected to the chamber; depositing the cap material layer 560*a* in the recess R and over the spacer 460 and the dielectric layer 510; stopping introducing the precursor and the carrier gas into the chamber; and purging away the unreacted precursor, in accordance with some embodiments. The number of the cycles of the deposition process ranges from about 20 to about 50, in accordance with some embodiments.

If the precursor includes $B_3N_3H_6$, the temperature of the tube ranges from about −20° C. to 5° C., in accordance with some embodiments. If the temperature of the tube is greater than 5° C., the precursor tends to crack, in accordance with some embodiments. If the precursor includes $B_3N_3H_5CH_3$, $B_3N_3H_5C_2H_5$, or $B_3N_3H_3(CH_3)_3$, the temperature of the tube ranges from about 20° C. to 30° C. (i.e., room temperature), in accordance with some embodiments.

Figure 4K:
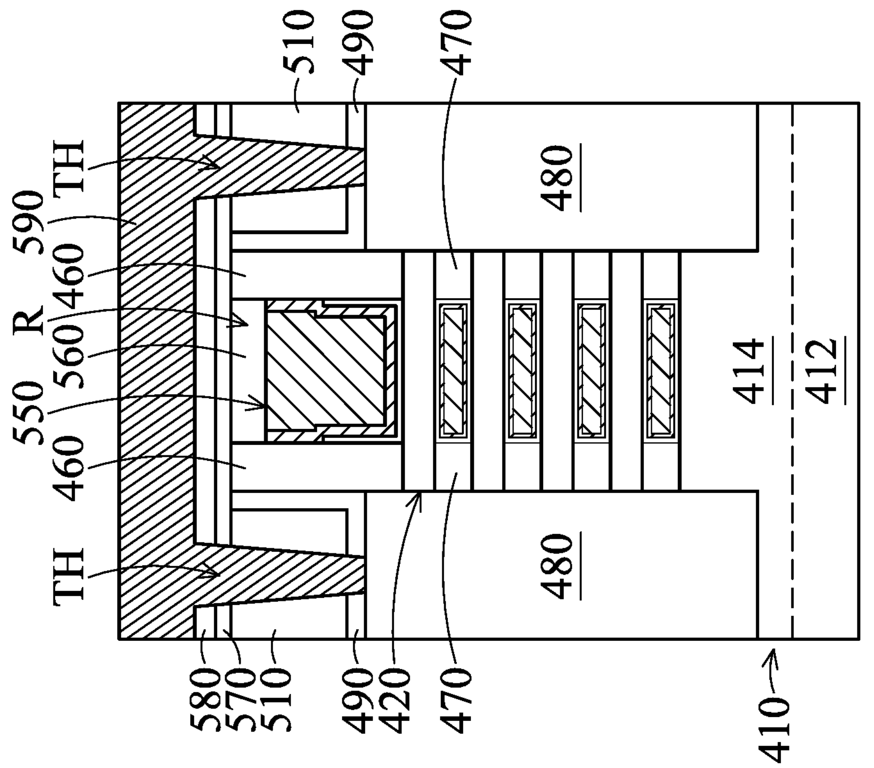

As shown in FIG. 4K, a portion of the cap material layer 560*a* outside of the recess R is removed, in accordance with some embodiments. The cap material layer 560*a* remaining in the recess R forms a cap layer 560, in accordance with some embodiments.

As shown in FIG. 4K, an etching stop layer 570 (also called an insulating layer or a dielectric layer) is deposited over the top surfaces of the dielectric layer 510, the spacer 460, the etch stop layer 490, and the cap layer 560, in accordance with some embodiments. The etching stop layer 570 is made of silicon nitride, in accordance with some embodiments.

As shown in FIG. 4K, a protective layer 580 is formed over the etching stop layer 570, in accordance with some embodiments. The protective layer 580 includes a plasma-enhanced oxide (PEOX) layer, in accordance with some embodiments.

As shown in FIG. 4K, portions of the protective layer 580, the etching stop layer 570, the dielectric layer 510, and the etch stop layer 490 are removed to form through holes TH, in accordance with some embodiments. The through holes TH pass through the protective layer 580, the etching stop layer 570, the dielectric layer 510, and the etch stop layer 490 to expose the source/drain structures 480, in accordance with some embodiments. The removal process includes performing a photolithography process and an etching process, in accordance with some embodiments.

As shown in FIG. 4K, a conductive layer 590 is deposited over the protective layer 580 and in the through holes TH to electrically contact with the source/drain structures 480, in accordance with some embodiments. The conductive layer 590 is formed by, for example, a PVD process or another suitable process. The conductive layer 590 is made of, for example, tungsten or another suitable conductive material.

Figures 1, 4L:
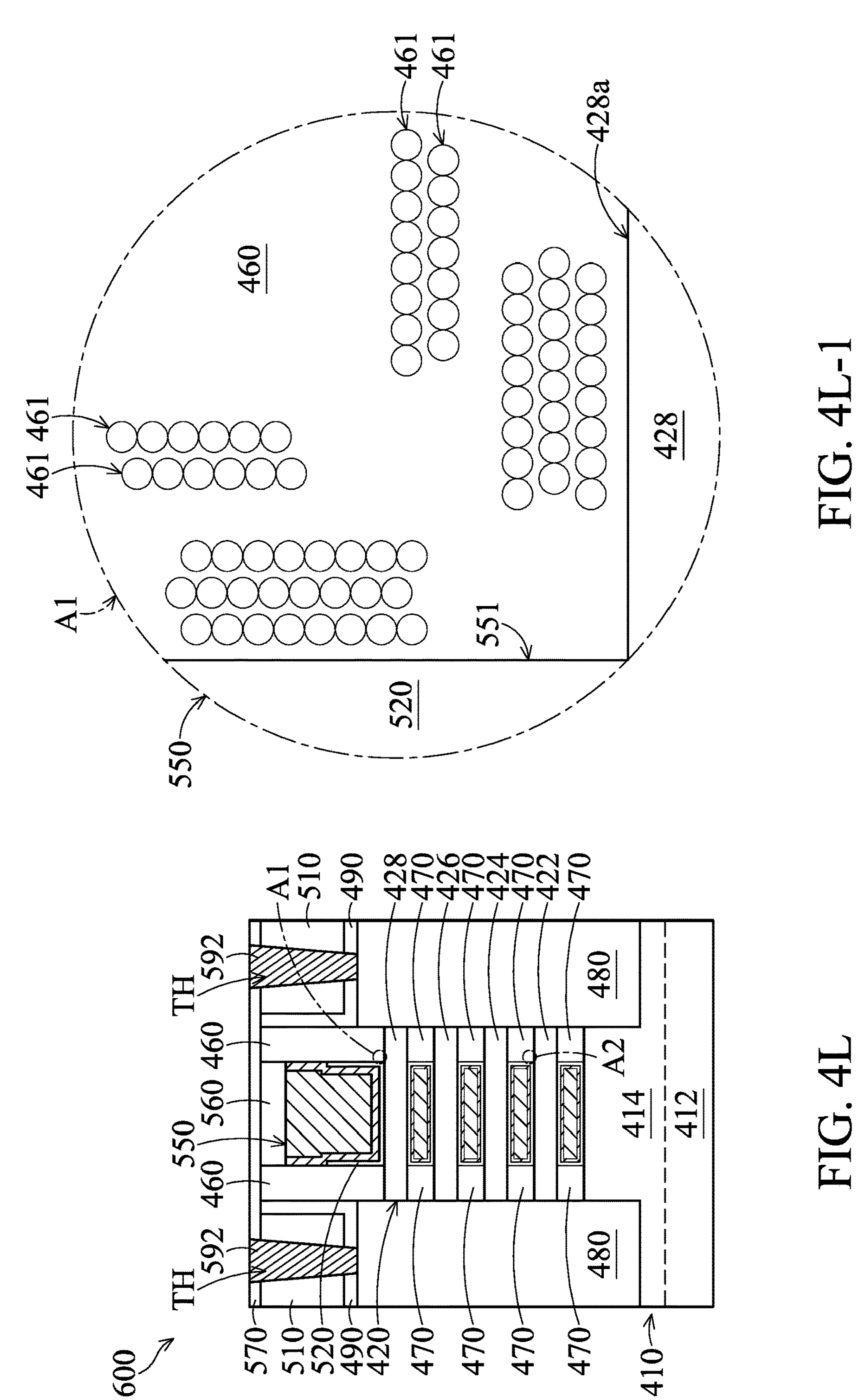
Figures 2, 4L:
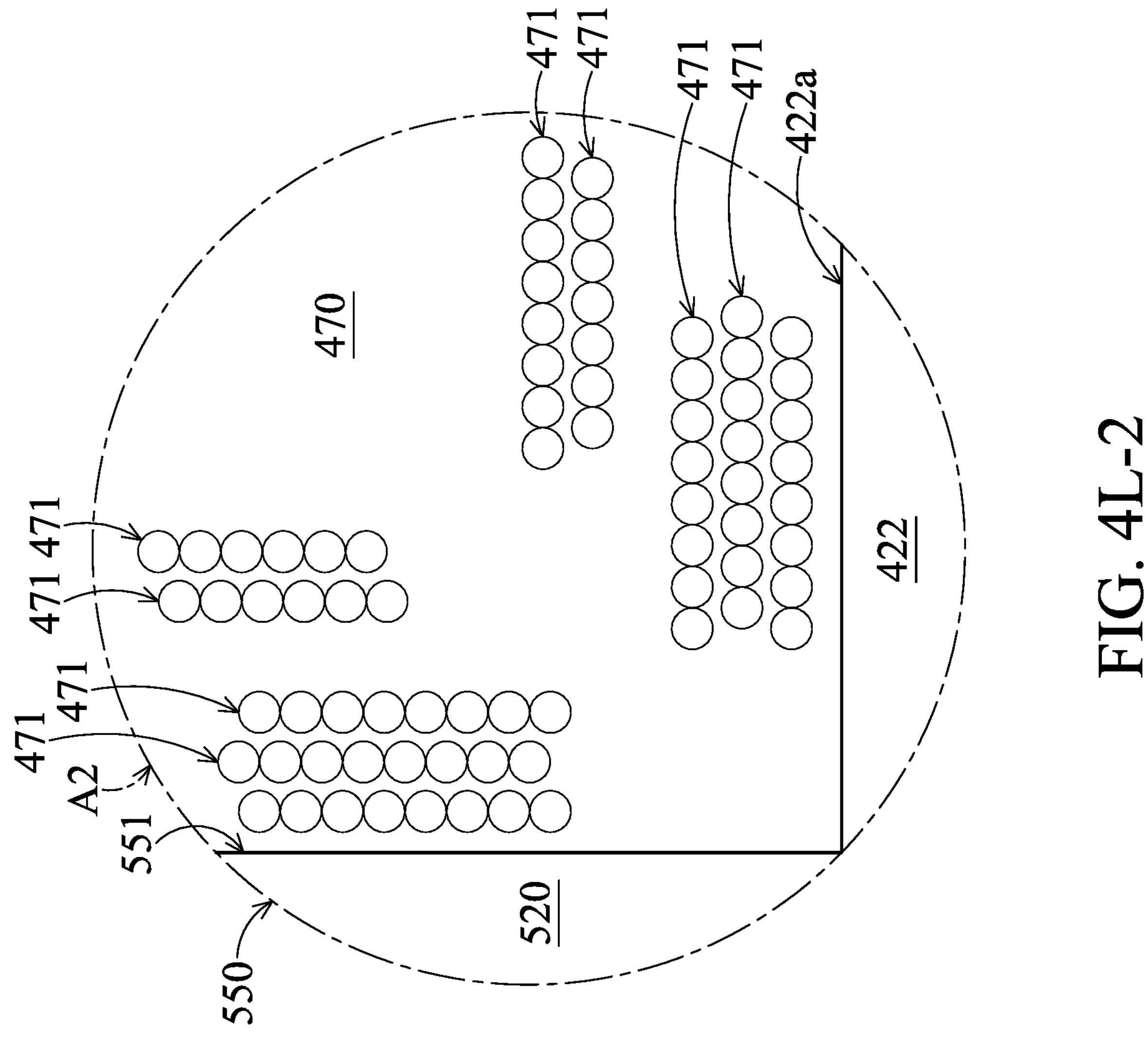

As shown in FIG. 4L, a planarization process is performed to remove the conductive layer 590 outside of the through holes TH and the protective layer 580, in accordance with some embodiments. In this step, a semiconductor device structure 600 is substantially formed, in accordance with some embodiments. The planarization process includes a chemical mechanical polishing (CMP) process, in accordance with some embodiments.

After the CMP process, the conductive layer 590 remaining in the through holes TH forms contact structures 592, in accordance with some embodiments. The contact structures 592 are electrically connected to the source/drain structures 480 respectively, in accordance with some embodiments. The contact structures 592 include contact plugs, in accordance with some embodiments.

FIG. 4L-1 is an enlarged view of one region A1 of the semiconductor device structure of FIG. 4L, in accordance with some embodiments. As shown in FIGS. 4L and 4L-1, some layers 461 of the spacer 460 are substantially parallel to the sidewall 551 of the gate stack 550, in accordance with some embodiments.

FIG. 4L-2 is an enlarged view of another one region A2 of the semiconductor device structure of FIG. 4L, in accordance with some embodiments. As shown in FIGS. 4L and 4L-2, some layers 471 of the inner spacer 470 are substantially parallel to the sidewall 551 of the gate stack 550, in accordance with some embodiments.

Processes and materials for forming the semiconductor device structures 600 may be similar to, or the same as, those for forming the semiconductor device structure 300 described above. Elements designated by the same or similar reference numbers as those in FIGS. 1A to 4L-2 have the same or similar structures and the materials. Therefore, the detailed descriptions thereof will not be repeated herein.

In accordance with some embodiments, semiconductor device structures and methods for forming the same are provided. The methods (for forming the semiconductor device structure) form a spacer, an inner spacer, a cap layer and/or an etch stop layer using an ultra-low-k material to reduce the parasitic capacitance of a semiconductor device structure. Therefore, the performance of the semiconductor device structure is improved. The ultra-low-k material includes a boron- and nitrogen-containing material having a hexagonal ring structure.

In accordance with some embodiments, a method for forming a semiconductor device structure is provided. The method includes forming a gate stack over a substrate. The method includes forming a spacer over first sidewalls of the gate stack using a first precursor. The first precursor includes a first boron- and nitrogen-containing material having a first hexagonal ring structure, the spacer has a plurality of first layers, and each first layer includes boron and nitrogen.

In accordance with some embodiments, a method for forming a semiconductor device structure is provided. The method includes providing a substrate having a base and a fin over the base. The method includes forming a nanostructure stack over the fin. The nanostructure stack includes a first nanostructure and a second nanostructure sequentially formed over the fin. The method includes forming a gate stack over the nanostructure stack and the fin. The method includes partially removing the nanostructure stack and the fin, which are not covered by the gate stack, to form a trench in the nanostructure stack and the fin. The method includes removing an end portion of the first nanostructure through the trench to form a recess in the nanostructure stack. The recess is between the fin and the second nanostructure. The method includes forming an inner spacer in the recess using a first precursor. The first precursor includes a first boron- and nitrogen-containing material having a first hexagonal ring structure, the inner spacer has a plurality of first layers, and each first layer includes boron and nitrogen.

In accordance with some embodiments, a semiconductor device structure is provided. The semiconductor device structure includes a substrate. The semiconductor device structure includes a gate stack over the substrate. The semiconductor device structure includes a spacer over first sidewalls of the gate stack. The spacer has a plurality of first layers, each first layer includes a first boron- and nitrogen-containing material having a first hexagonal ring structure, and one of the first layers is substantially parallel to the first sidewall of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
- forming a gate stack over a substrate;
- forming a spacer over a first sidewall of the gate stack using a first precursor, wherein the first precursor comprises a first boron- and nitrogen-containing material having a first hexagonal ring structure, the spacer has a plurality of first layers, and each first layer comprises boron and nitrogen;
- forming a dielectric layer over the substrate;
- removing the gate stack, wherein a trench is formed in the spacer after removing the gate stack;
- forming a metal gate stack in the trench, wherein the metal gate stack comprises a gate dielectric layer, a work function metal layer, and a gate electrode layer, and the gate electrode layer is over the work function layer;
- removing a top portion of the metal gate stack, wherein a recess is formed and is surrounded by the spacer and adjacent to the metal gate stack; and
- forming a cap layer in the recess using a second precursor, wherein the second precursor comprises a boron-, nitrogen-, and carbon-containing material having a second hexagonal ring structure, the cap layer has a plurality of second layers, and each second layer comprises boron, nitrogen, and carbon, wherein the cap layer interfaces with the work function layer.

2. The method for forming the semiconductor device structure as claimed in claim 1, wherein one of the first layers is substantially parallel to the first sidewall of the gate stack.

3. The method for forming the semiconductor device structure as claimed in claim 2, wherein another one of the first layers is substantially parallel to a top surface of the substrate.

4. The method for forming the semiconductor device structure as claimed in claim 1, wherein the first boron- and nitrogen-containing material comprises $B_3N_3H_6$, $B_3N_3H_5CH_3$, $B_3N_3H_5C_2H_5$, or $B_3N_3H_3(CH_3)_3$.

5. The method for forming the semiconductor device structure as claimed in claim 1, wherein each first layer comprises hexagonal boron nitride or hexagonal boron carbon nitride.

6. The method for forming the semiconductor device structure as claimed in claim 1, further comprising:
- forming a first source/drain structure and a second source/drain structure over the substrate, wherein the gate stack is between the first source/drain structure and the second source/drain structure; and forming an etch stop layer over a second sidewall of the spacer, the first source/drain structure, and the second source/drain structure using a third precursor, wherein the third precursor comprises a second boron- and nitrogen-containing material having a third hexagonal ring structure, the etch stop layer has a plurality of third layers, and each third layer comprises boron and nitrogen.

7. The method for forming the semiconductor device structure as claimed in claim 6, wherein one of the third layers is substantially parallel to the second sidewall of the spacer.

8. The method for forming the semiconductor device structure as claimed in claim 7, wherein another one of the third layers is substantially parallel to a top surface of the first source/drain structure.

9. The method for forming the semiconductor device structure as claimed in claim 1, wherein one of the second layers is substantially parallel to a top surface of the metal gate stack.

10. The method for forming the semiconductor device structure as claimed in claim 1, wherein the work function layer conformally extends along a first interior sidewall of the spacer, a top of the gate dielectric layer, and a second interior sidewall of the gate dielectric layer.

11. A method for forming a semiconductor device structure, comprising:

providing a substrate having a base and a fin over the base;

forming a nanostructure stack over the fin, wherein the nanostructure stack comprises a first nanostructure and a second nanostructure sequentially formed over the fin;

forming a gate stack over the nanostructure stack and the fin;

partially removing the nanostructure stack and the fin, which are not covered by the gate stack, to form a trench in the nanostructure stack and the fin;

removing an end portion of the first nanostructure through the trench to form a recess in the nanostructure stack, wherein the recess is between the fin and the second nanostructure;

forming an inner spacer in the recess using a first precursor, wherein the first precursor comprises a first boron- and nitrogen-containing material having a first hexagonal ring structure, the inner spacer has a plurality of first layers, and each first layer comprises boron and nitrogen;

replacing the gate stack with a metal gate stack, wherein the metal gate stack comprises a gate dielectric layer, a work function metal layer, and a gate electrode layer, and the gate electrode layer is over the work function layer;

removing an upper portion of the metal gate stack; and forming a cap layer over the metal gate stack using a second precursor after the upper portion of the metal gate stack is removed, wherein the second precursor comprises a boron-, nitrogen-, and carbon-containing material having a second hexagonal ring structure, the cap layer has a plurality of second layers, and each second layer comprises boron, nitrogen, and carbon, wherein the work function layer is closer to the cap layer than the gate dielectric layer.

12. The method for forming the semiconductor device structure as claimed in claim 11, wherein the first boron- and nitrogen-containing material comprises $B_3N_3H_6$, $B_3N_3H_5CH_3$, $B_3N_3H_5C_2H_5$, or $B_3N_3H_3(CH_3)_3$.

13. The method for forming the semiconductor device structure as claimed in claim 11, wherein the first layer comprises hexagonal boron nitride or hexagonal boron carbon nitride.

14. The method for forming the semiconductor device structure as claimed in claim 11, further comprising:

before partially removing the nanostructure stack and the fin, forming a spacer over sidewalls of the gate stack using a third precursor, wherein the third precursor comprises a second boron- and nitrogen-containing material having a third hexagonal ring structure, the spacer has a plurality of third layers, and each third layer comprises boron and nitrogen.

15. The method for forming the semiconductor device structure as claimed in claim 11, wherein the work function layer covers a topmost surface of the gate dielectric layer.

16. A semiconductor device structure, comprising:

a substrate;

a gate stack over the substrate, wherein the gate stack comprises a gate dielectric layer, a work function metal layer, and a gate electrode layer, and the gate electrode layer is over the work function layer;

a spacer over first sidewalls of the gate stack, wherein the spacer has a plurality of first layers, each first layer comprises a first boron- and nitrogen-containing material having a first hexagonal ring structure, and one of the first layers is substantially parallel to the first sidewall of the gate stack; and a cap layer over the gate stack and laterally surrounded by the spacer, wherein the cap layer has a plurality of second layers, each second layer comprises a boron-, nitrogen-, and carbon-containing material having a second hexagonal ring structure, and one of the second layers is substantially perpendicular to one of the first layers, wherein the work function layer extends upward along the spacer to reach the cap layer.

17. The semiconductor device structure as claimed in claim 16, wherein another one of the first layers is substantially parallel to a top surface of the substrate.

18. The semiconductor device structure as claimed in claim 16, further comprising:

an etch stop layer over a second sidewall of the spacer and the substrate, wherein the etch stop layer has a plurality of third layers, each third layer comprises a second boron- and nitrogen-containing material having a third hexagonal ring structure, and one of the third layers is substantially parallel to the second sidewall.

19. The semiconductor device structure as claimed in claim 16, wherein the gate dielectric layer is separated from the cap layer by the work function metal layer.

20. The semiconductor device structure as claimed in claim 16, wherein the work function layer has an upper sidewall, a lower sidewall, and a lower surface, the upper sidewall and the lower sidewall face the spacer, and the lower surface connects between the upper sidewall and the lower sidewall.

* * * * *